(12) United States Patent
Abe

(10) Patent No.: US 10,897,026 B2
(45) Date of Patent: Jan. 19, 2021

(54) DISPLAY DEVICE AND MANUFACTURING METHOD OF DISPLAY DEVICE

(71) Applicant: Sharp Kabushiki Kaisha, Sakai (JP)

(72) Inventor: Kaoru Abe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/467,165

(22) PCT Filed: Aug. 9, 2017

(86) PCT No.: PCT/JP2017/028937
§ 371 (c)(1),
(2) Date: Jun. 6, 2019

(87) PCT Pub. No.: WO2019/030858
PCT Pub. Date: Feb. 14, 2019

(65) Prior Publication Data
US 2019/0326553 A1 Oct. 24, 2019

(51) Int. Cl.
*H01L 51/52* (2006.01)
*H01L 51/50* (2006.01)
(Continued)

(52) U.S. Cl.
CPC ...... *H01L 51/5253* (2013.01); *H01L 27/3244* (2013.01); *H01L 51/0096* (2013.01); *H01L 2227/323* (2013.01)

(58) Field of Classification Search
CPC . H01L 51/0096; H01L 51/50; H01L 51/5253; H01L 51/5259; H01L 51/5237; H01L 51/5203; H01L 51/56; H01L 51/5246; H01L 27/3244; H01L 27/3258; H01L 27/3246; H01L 27/32; H01L 27/3251; H01L 27/3253; H01L 27/3225; H01L 27/326; H01L 27/3262; H01L 2227/323; H01L 2251/50;
(Continued)

(56) References Cited

U.S. PATENT DOCUMENTS

2002/0084464 A1 7/2002 Yamazaki et al.
2005/0218396 A1 10/2005 Tsuchiya et al.
(Continued)

FOREIGN PATENT DOCUMENTS

JP 2002-246183 A 8/2002
JP 2005-302707 A 10/2005
(Continued)

OTHER PUBLICATIONS

Official Communication issued in International Patent Application No. PCT/JP2017/028937, dated Nov. 7, 2017.

*Primary Examiner* — Natalia A Gondarenko
(74) *Attorney, Agent, or Firm* — Keating & Bennett, LLP

(57) ABSTRACT

To improve a degree of design freedom of a display surface of a device while maintaining a reliability of the device, provided is a display device including an active region that contributes to a display, and a notch formed in a position surrounded by an end portion of the active region. A protruding portion is formed on a peripheral end side of the active region where the notch is formed. A light-emitting layer is disconnected as a result of a step at the protruding portion.

12 Claims, 30 Drawing Sheets

(51) Int. Cl.
*H01L 51/56* (2006.01)
*H01L 27/32* (2006.01)
*H01L 51/00* (2006.01)

(58) Field of Classification Search
CPC ..... H01L 2251/5315; H01L 2251/5338; H01L 2251/554; H01L 2251/558; H01L 27/3202; H01L 27/3204; H01L 27/3276; H01L 27/3279; H01L 27/3283; H01L 27/3288; H01L 27/329; H01L 27/3248; H01L 51/0002; H01L 51/10; H01L 51/102; H01L 51/107; H01L 51/5012; H01L 51/5072; H01L 51/5056; H01L 51/5048; H01L 51/504; H01L 51/52; H01L 51/5209; H01L 51/5212; H01L 51/5215; H01L 51/5221; H01L 51/5225; H01L 51/5231; H01L 51/524; H01L 2924/161; H01L 2924/1615; H01L 2924/16151; H01L 2924/1616; H05B 33/04; H05B 33/22; H05B 33/26; G09F 9/00; G09F 9/30; G09G 3/3233; G09G 3/3225
USPC ............................ 257/40, 59, 72; 438/34, 46
See application file for complete search history.

(56) References Cited

U.S. PATENT DOCUMENTS

| | | |
|---|---|---|
| 2007/0188093 A1 | 8/2007 | Nagara et al. |
| 2011/0001146 A1 | 1/2011 | Yamazaki et al. |
| 2012/0205700 A1 | 8/2012 | Tanada et al. |
| 2017/0031323 A1* | 2/2017 | Kim ................... H01L 27/3258 |
| 2017/0148856 A1* | 5/2017 | Choi .................. H01L 27/3258 |
| 2017/0237038 A1* | 8/2017 | Kim ................... H01L 51/5253 |
| | | 257/40 |
| 2017/0288004 A1* | 10/2017 | Kim ................... H01L 27/3276 |
| 2018/0019290 A1* | 1/2018 | Arai ...................... H05B 33/22 |
| 2018/0061315 A1* | 3/2018 | Kim ................... H01L 27/3248 |
| 2019/0173053 A1* | 6/2019 | Choi ..................... H01L 27/323 |

FOREIGN PATENT DOCUMENTS

| | | |
|---|---|---|
| JP | 2007-114346 A | 5/2007 |
| JP | 2007-250520 A | 9/2007 |
| JP | 2010-008317 A | 1/2010 |
| JP | 2010-014475 A | 1/2010 |
| JP | 2011-029176 A | 2/2011 |
| JP | 2012-182121 A | 9/2012 |
| JP | 2014-191979 A | 10/2014 |
| JP | 2014-197623 A | 10/2014 |

* cited by examiner

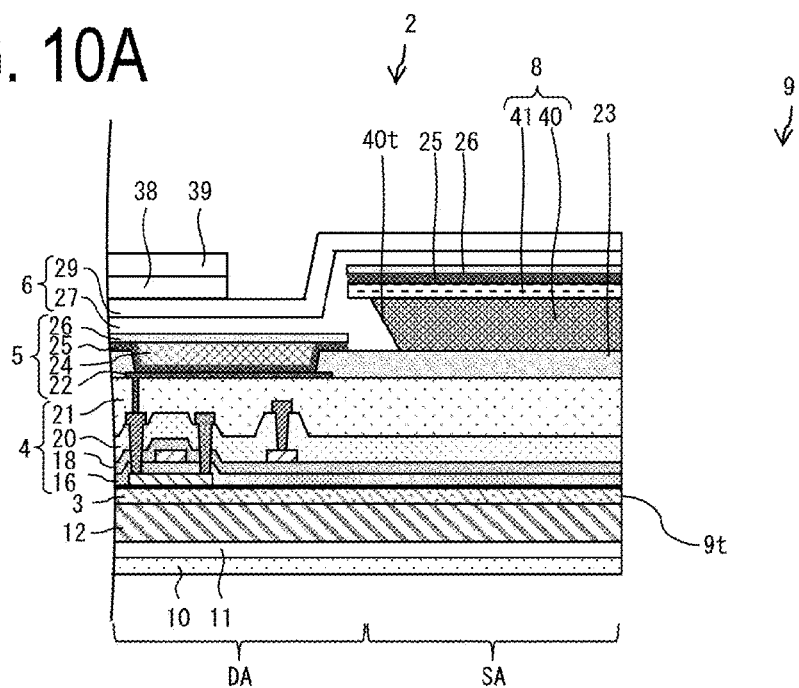
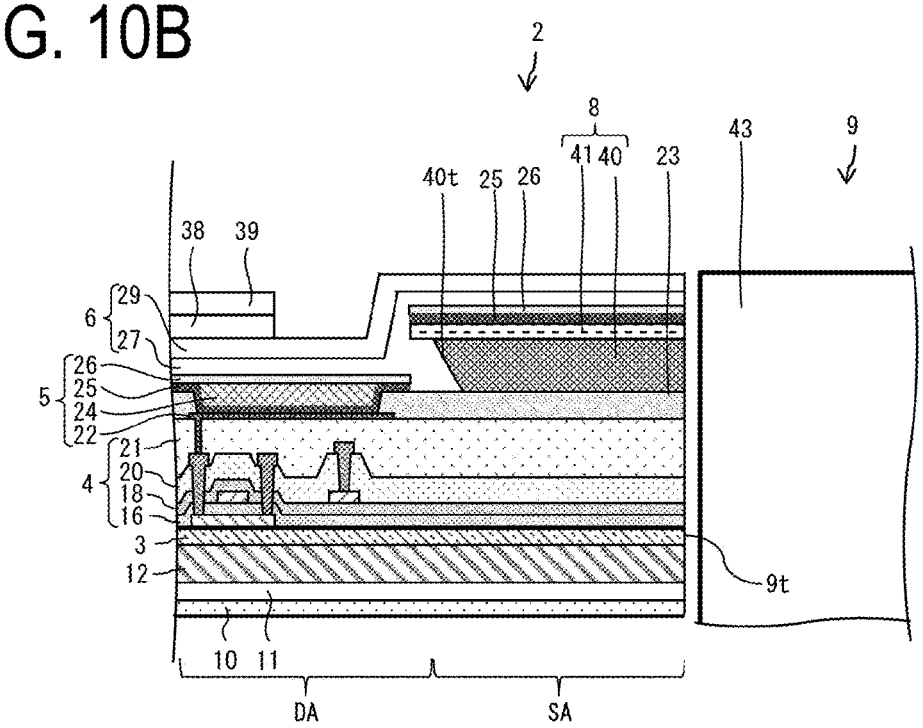

DISPLAY DEVICE AND MANUFACTURING METHOD OF DISPLAY DEVICE

TECHNICAL FIELD

The disclosure relates to a display device including a light-emitting layer provided with a light-emitting element in an active region.

BACKGROUND ART

In general, when an external module is mounted on a display device that includes a light-emitting element on a base material, the external module is mounted in a non-active area on an outer side of an active region. In this case, an entire face of the device cannot serve as a display surface, resulting in deterioration of a designability of the display device. To provide a display device with improved designability by moving the improving the degree of freedom in designing a display surface of the display device, a configuration in which the external module is supported in the active region of the display device is conceivable.

When an opening is formed in the active region of the display device to support the external module in the active region of the display device, foreign matters such as moisture may penetrate from an end face of the opening. As a result, the light-emitting element may be deactivated by the foreign matters, and a display abnormality around the opening may occur.

In PTL 1, there are described an organic electroluminescent (EL) device having a structure in which an end face of an organic light-emitting layer provided with a light-emitting element is covered by a sealing layer in a light-emitting region on an outer peripheral side of a non emissive region, and a manufacturing method of the device.

CITATION LIST

Patent Literature

PTL 1: JP 2014-197623 A (published Oct. 16, 2014).

SUMMARY

Technical Problem

In a manufacturing process of the organic EL device of PTL 1, a groove dividing the region needs to be formed using a laser scribing apparatus after formation of the organic light-emitting layer. As a result, the possibility exists that the light-emitting element of the organic light-emitting layer may incur damage during use of the laser scribing apparatus.

Solution to Problem

To solve the problems described above, a display device of the present application includes a base material, a TFT layer formed on the base material, an organic insulating film formed on the TFT layer, a light-emitting layer formed on the organic insulating film, and a sealing layer formed on the light-emitting layer. The display device further includes an active region configured to contribute to a display, a notch formed in a position surrounded by an end portion of the active region, and a protruding portion formed on a peripheral end side of the active region where the notch is formed. In such a display device, the light-emitting layer is disconnected as a result of a step at the protruding portion.

A manufacturing method of a display device of the present application is a manufacturing method of a display device including a base material, a TFT layer formed on the base material, an organic insulating film formed on the TFT layer, a light-emitting layer formed on the organic insulating film, and a sealing layer formed on the light-emitting layer. The manufacturing method includes a protruding portion forming step for forming a protruding portion below the light-emitting layer, a light-emitting layer forming step for forming the light-emitting layer on the organic insulating film and the protruding portion, and disconnecting the light-emitting layer as a result of a step at the protruding portion, and a notch forming step for forming a notch in a position surrounded by the protruding portion.

Further, a manufacturing apparatus of a display device of the present application is a manufacturing apparatus of a display device including a base material, a TFT layer formed on the base material, an organic insulating film formed on the TFT layer, a light-emitting layer formed on the organic insulating film, and a sealing layer formed on the light-emitting layer. The manufacturing apparatus includes a film formation apparatus configured to form a protruding portion below the light-emitting layer and the light-emitting layer on the organic insulating film and the protruding portion, and disconnect the light-emitting layer as a result of a step at the protruding portion, and a notch formation apparatus configured to form a notch in a position surrounded by the protruding portion.

Advantageous Effects of Disclosure

The display device of the present application includes the notch formed in a position surrounded by the end portion of the active region, and the protruding portion formed on the peripheral end side of the active region where the notch is formed, and the light-emitting layer is disconnected as a result of a step at the protruding portion. As a result, it is possible to provide a display device having reduced penetration of foreign matters into the light-emitting layer in the active region by a manufacturing method that reduces damage incurred by the light-emitting layer while maintaining a degree of design freedom of the display surface.

BRIEF DESCRIPTION OF DRAWINGS

FIGS. 10A and 10B are other process cross-sectional views illustrating manufacturing processes of the display device according to the first embodiment of the disclosure, in order.

DESCRIPTION OF EMBODIMENTS

First Embodiment

Figure 1:
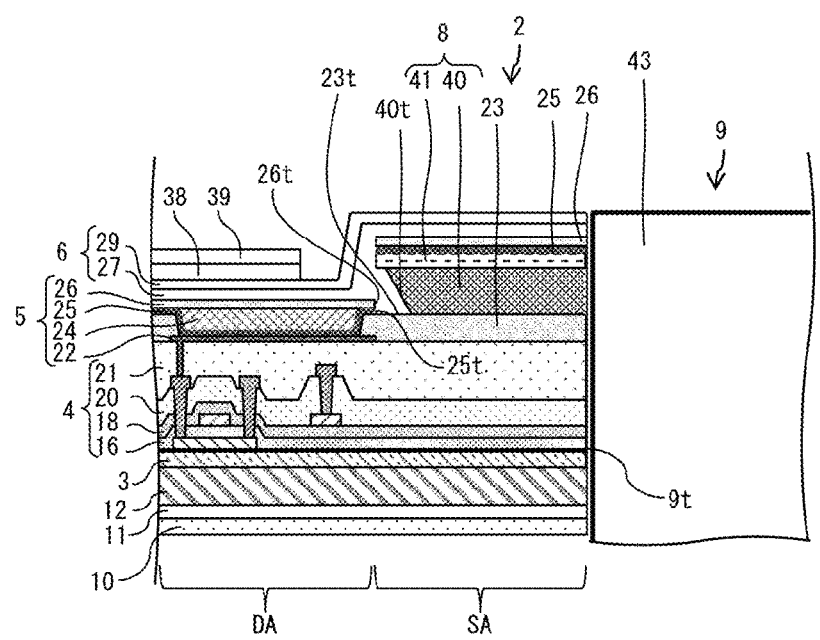
FIG. 1 is a cross-sectional side view illustrating a boundary periphery between an external module and an active region of a display device according to a first embodiment of the disclosure.
Figure 2:
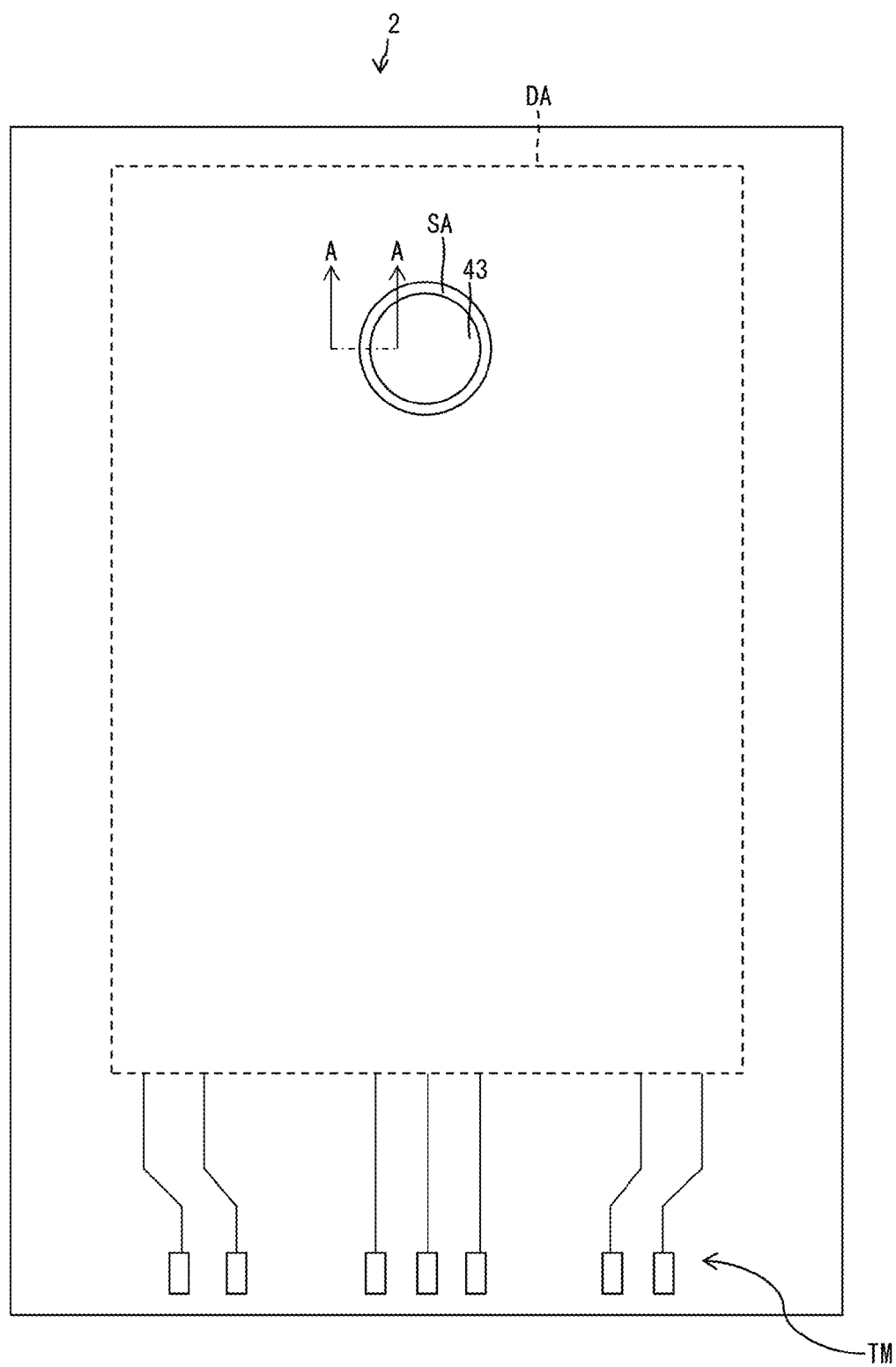
FIG. 2 is a top view of the display device according to the first embodiment of the disclosure.
Figure 3A:
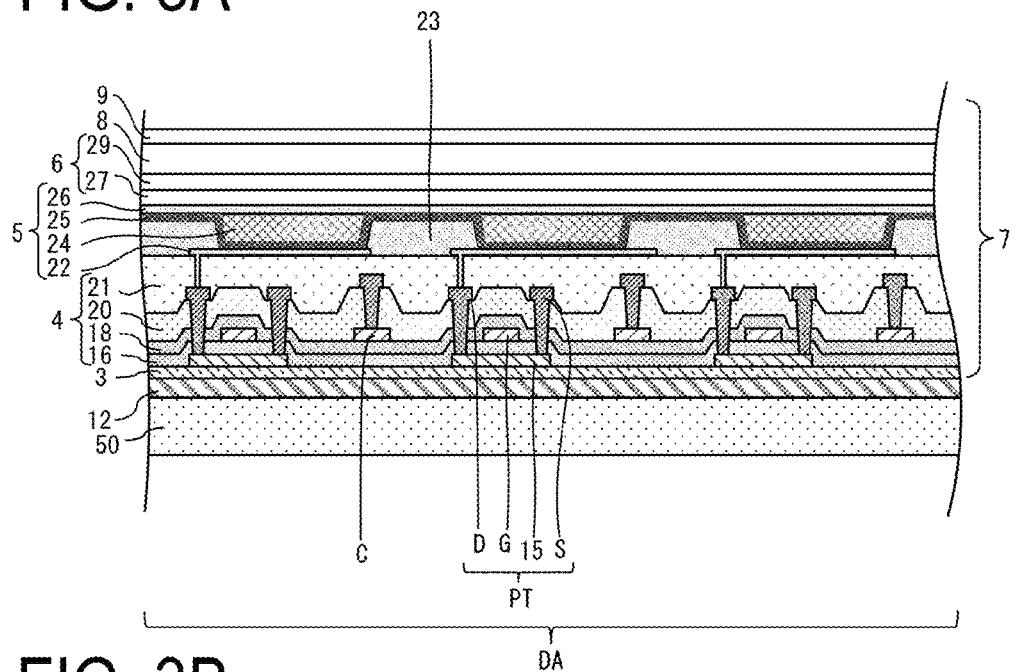
FIGS. 3A and 3B are cross-sectional views of a pixel area periphery of the display device according to the first embodiment of the disclosure.
Figure 3B:
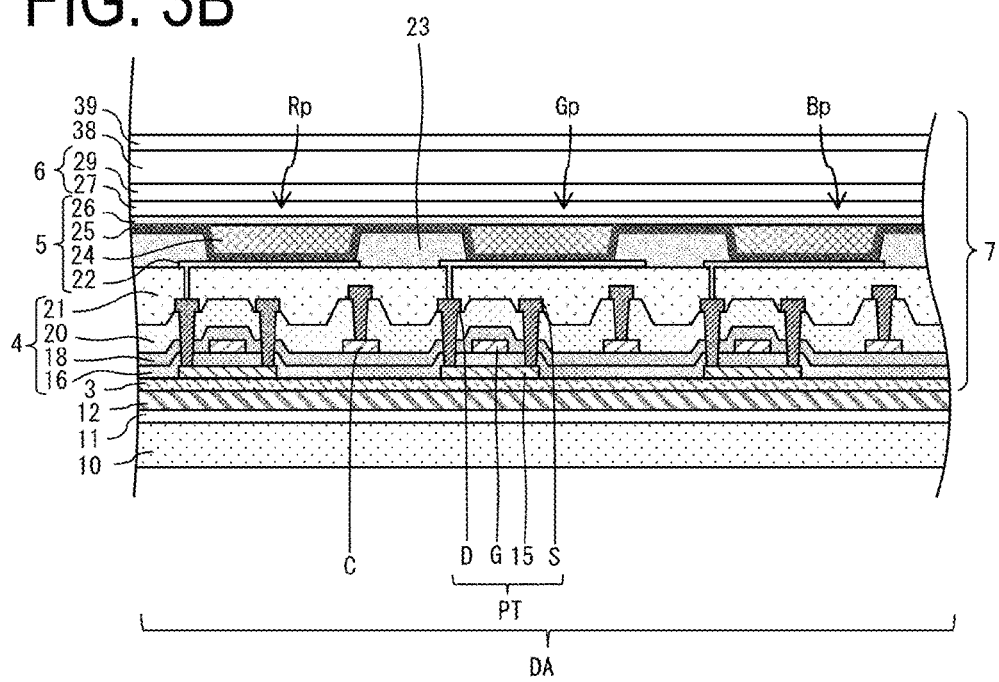

FIG. 2 is a top view illustrating a display device 2 according to a first embodiment. FIG. 1 is a cross-sectional view taken along line A-A in the direction of arrows in FIG. 2, that is, a cross-sectional view of a periphery of an outer edge of an external module 43 of the display device 2. FIGS. 3A and 3B illustrate cross-sectional views of a periphery of a pixel area including a light-emitting layer 5 of the display device 2.

A manufacturing method of a display device according to the present embodiment will now be described with reference to FIGS. 1 to 3B, following a flowchart illustrated in FIG. 4.

As illustrated in FIG. 3B, first, a resin layer 12 is formed on a base material 10 (step S1). Next, a barrier layer 3 is formed (step S2). Next, a thin-film transistor (TFT) layer 4 including a gate insulating film 16, passivation films 18, 20, and an organic interlayer film 21 is formed (step S3). Next, a protruding portion 8 illustrated in FIG. 1, and the light emitting layer (for example, an organic light-emitting diode (OLED) layer) 5 are formed (step S4). Next, a sealing layer 6 including an inorganic sealing film 27 and an inorganic sealing film 29 is formed to obtain a layered body 7 (step S5). Next, a notch 9 is formed (step S10). Next, the external module 43 is mounted on the notch 9 (step S11). Next, the layered body 7 is divided and singulated along with the base material 10 (step S12). Next, a function film 39 is affixed via an adhesive layer 38 (step S13). Next, an electronic circuit board is mounted on an end portion of the TFT layer 4 (step S14). In this way, the display device 2 illustrated in FIGS. 3A and 3B is obtained.

Note that, in the manufacture of a flexible display device, as illustrated in FIG. 3A, for example, the layered body 7 (the resin layer 12, the barrier layer 3, the TFT layer 4, the light-emitting layer 5, and the sealing layer 6) are formed first on a glass substrate 50. Next, an upper face film is affixed (step S6), and a lower face of the resin layer 12 is irradiated with a laser light through the glass substrate 50 (step S7). Here, the lower face (the interface with the glass substrate 50) of the resin layer 12 is altered by ablation, and the bonding force between the resin layer 12 and the glass substrate 50 is reduced. Next, the glass substrate 50 is peeled from the resin layer 12 (step S8). Next, the base material 10 (for example, a lower face film made of polyethylene terephthalate (PET) or the like) is affixed to the lower face of the resin layer 12 via an adhesive layer 11 (step S9). Subsequently, the process proceeds to step S10 described above.

Examples of the material of the resin layer 12 include polyimide, epoxy, and polyamide. Examples of the material used in the lower face film include PET.

The barrier layer 3 is a layer for preventing foreign matters such as moisture and impurities from reaching the TFT layer 4 and the light-emitting layer 5 during usage of the display device. The barrier layer 3 may be made of a silicon oxide film, a silicon nitride film, or a silicon oxynitride film formed by chemical vapor deposition (CVD), or a layered film thereof, for example.

The TFT layer 4 includes a semiconductor film 15, the gate insulating film 16, a gate electrode G, the passivation films 18, 20, a capacitance electrode C, a terminal TM, a source wiring line S and a drain wiring line D, and the organic interlayer film (flattening film) 21. The gate insulating film 16 is formed above the semiconductor film 15. The gate electrode G is formed above the gate insulating film 16. The passivation films 18, 20 are formed above the gate electrode G. The capacitance electrode C and the terminal TM are formed above the passivation film 18. The source wiring line S and the drain wiring line D are formed above the passivation film 20. The organic interlayer film 21 is formed above the source wiring line S and the drain wiring line D. A TFT is configured to include the semiconductor film 15, the gate insulating film 16, and the gate electrode G. In the non-active area, a plurality of terminals used for connection with an electronic circuit board are formed in a metal layer of the TFT layer 4.

The semiconductor film 15 is formed of, for example, low temperature polysilicon (LTPS) or an oxide semiconductor. The gate insulating film 16 can be formed of, for example, a silicon oxide (SiOx) film, a silicon nitride (SiNx) film, or a layered film thereof formed using a CVD method. The gate electrode G, the source electrode S, the drain electrode D, and the terminals are formed of, for example, a single layer film or a layered film of metal. The metal includes, for example, at least one of aluminum (Al), tungsten (W), molybdenum (Mo), tantalum (Ta), chromium (Cr), titanium (Ti), and copper (Cu). Note that, in FIGS. 2A and 2B, the TFT is illustrated that has a top gate structure in which the semiconductor film 15 is the channel, but the TFT may have a bottom gate structure (when the TFT channel is the oxide semiconductor, for example).

The gate insulating film 16 and the passivation films 18 and 20 can be formed of, for example, a silicon oxide (SiOx) film, a silicon nitride (SiNx) film, or a layered film thereof formed using a CVD method. The organic interlayer film 21 can be formed of a coatable photosensitive organic material, such as polyimide or acrylic, for example.

The light-emitting layer 5 (for example, an organic light-emitting diode layer) includes a first electrode 22 (for example, an anode electrode), an organic insulating film 23, an electroluminescent (EL) light-emitting layer 24, an EL common layer 25, and a second electrode 26. The first electrode 22 is formed above the organic interlayer film 21. The organic insulating film 23 covers an edge of the first electrode 22. The EL light-emitting layer 24 and the EL common layer 25 are formed above the first electrode 22. The second electrode 26 is formed above the EL light-emitting layer 24 and the EL common layer 25. The light-emitting element (for example, the organic light-emitting diode) is formed of the first electrode 22, the EL light-emitting layer 24, the EL common layer 25, and the second electrode 26. The organic insulating film 23 in an active region DA functions as a bank (pixel partition) that defines subpixels. The light-emitting layer 5 formed in the active region DA functions as a valid layer that contributes to the display of the display device 2.

The organic insulating film 23 can be made of a coatable photosensitive organic material such as polyimide or acrylic, for example. For example, the organic insulating film 23 can be applied to the active region DA and a non-active area on an outer side of the active region DA by a slit coating method.

The EL light-emitting layer 24 is formed in a region (subpixel region) surrounded by the organic insulating film 23 by vapor deposition. The EL common layer 25 is, for example, formed above the first electrode 22 and the organic insulating film 23 by vapor deposition. In the case that the light-emitting layer 5 is an organic light-emitting diode (OLED) layer, the EL light-emitting layer 24 and the EL common layer 25 are formed by, for example, layering a hole injecting layer, a hole transport layer, a light-emitting layer, an electron transport layer, and an electron injecting layer sequentially from the lower layer side. Note that one or more layers of the EL light-emitting layer 24 may be a common layer (shared by a plurality of pixels) like the EL common layer 25.

The first electrode (anode) 22 is formed by a layering of, for example, indium tin oxide (ITO) and an alloy including silver (Ag), and the first electrode (anode) 22 has light reflectivity. The second electrode (for example, a cathode electrode) 26 is a common electrode, and may be formed of a transparent metal such as indium tin oxide (ITO) or indium zinc oxide (IZO).

In the case that the light-emitting layer 5 is an OLED layer, holes and electrons are recombined in the EL light-emitting layer 24 by a driving current between the first electrode 22 and the second electrode 26 and the excitons generated thereby fall to the ground state such that light is emitted. The light-emitting layer 5 is not limited to OLED element configurations, and the light-emitting layer 5 may be an inorganic light-emitting diode or a quantum dot light-emitting diode.

The sealing layer 6 covers the light-emitting layer 5 and prevents penetration of foreign matters, such as water, oxygen and the like, into the light-emitting layer 5. The sealing layer 6 includes the inorganic sealing film 27 covering the organic insulating film 23 and the second electrode 26, and the inorganic sealing film 29 formed above the inorganic sealing film 27 and covering the inorganic sealing film 27.

The function film 39 includes, for example, an optical compensation function, a touch sensor function, a protection function, or the like. In a case that layers having one or more of these functions are layered above the light-emitting layer 5, the function film 39 may be made thinner or removed. The electronic circuit board is, for example, an integrated circuit (IC) chip or a flexible printed circuit board (FPC) mounted on the terminal TM illustrated in FIG. 2.

As illustrated in FIG. 1, the display device 2 includes the notch 9 communicating from the display surface to the base material 10, and the display device 2 supports the external module 43 in the notch 9. As illustrated in FIG. 2, the external module 43 is supported in an interior of the notch formed in a position surrounded by the end portion of the active region DA contributing to the display of the display device 2. That is, the active region DA exists across the entire circumferential direction of the notch 9.

As illustrated in FIG. 1, a frame region SA is formed between the active region DA and the notch 9. As illustrated in FIG. 2, the frame region SA is formed in a position that surrounds the entire circumference of the external module 43 supported in the notch 9. The protruding portion 8, the EL common layer 25, and the second electrode 26 are layered in that order above the organic insulating film 23 of the frame region SA, as illustrated in FIG. 1.

The protruding portion 8 includes a metal layer 40 made of a metal material, and a resist layer 41 formed on an upper layer of the metal layer 40 and made of a photosensitive resin. Among side faces of the metal layer 40, the side face close to the active region DA constitutes an inversely tapered face 40t that inclines to the side facing the notch 9, from the display surface toward the base material 10. In a planar view, an end face 25t of the EL common layer 25 is formed on an upper face 23t of the organic insulating film 23 overlapping the inversely tapered face 40t.

The EL common layer 25 and the second electrode 26 of the active region DA are formed on an upper layer of any one of the first electrode 22, the organic insulating film 23, and the EL light-emitting layer 24. On the other hand, an EL layer 25s and a second electrode 26s of the frame region SA are formed on an upper layer of the protruding portion 8. Furthermore, the EL common layer 25 and the second electrode 26 are not connected between the active region DA and the frame region SA. That is, between the active region DA and the frame region SA, the light-emitting layer 5 is disconnected as a result of a step. As a result of this disconnection of the light-emitting layer 5 as a result of a step, the EL common layer 25 includes an end face 25t, and the second electrode 26 includes an end face 26t. The end faces 25t, 26t are covered by the inorganic sealing film 27.

A manufacturing method of members of the frame region SA and the notch 9 of the display device 2 according to the present embodiment will now be described in detail with reference to FIG. 5 to FIG. 10B.

Figure 4:
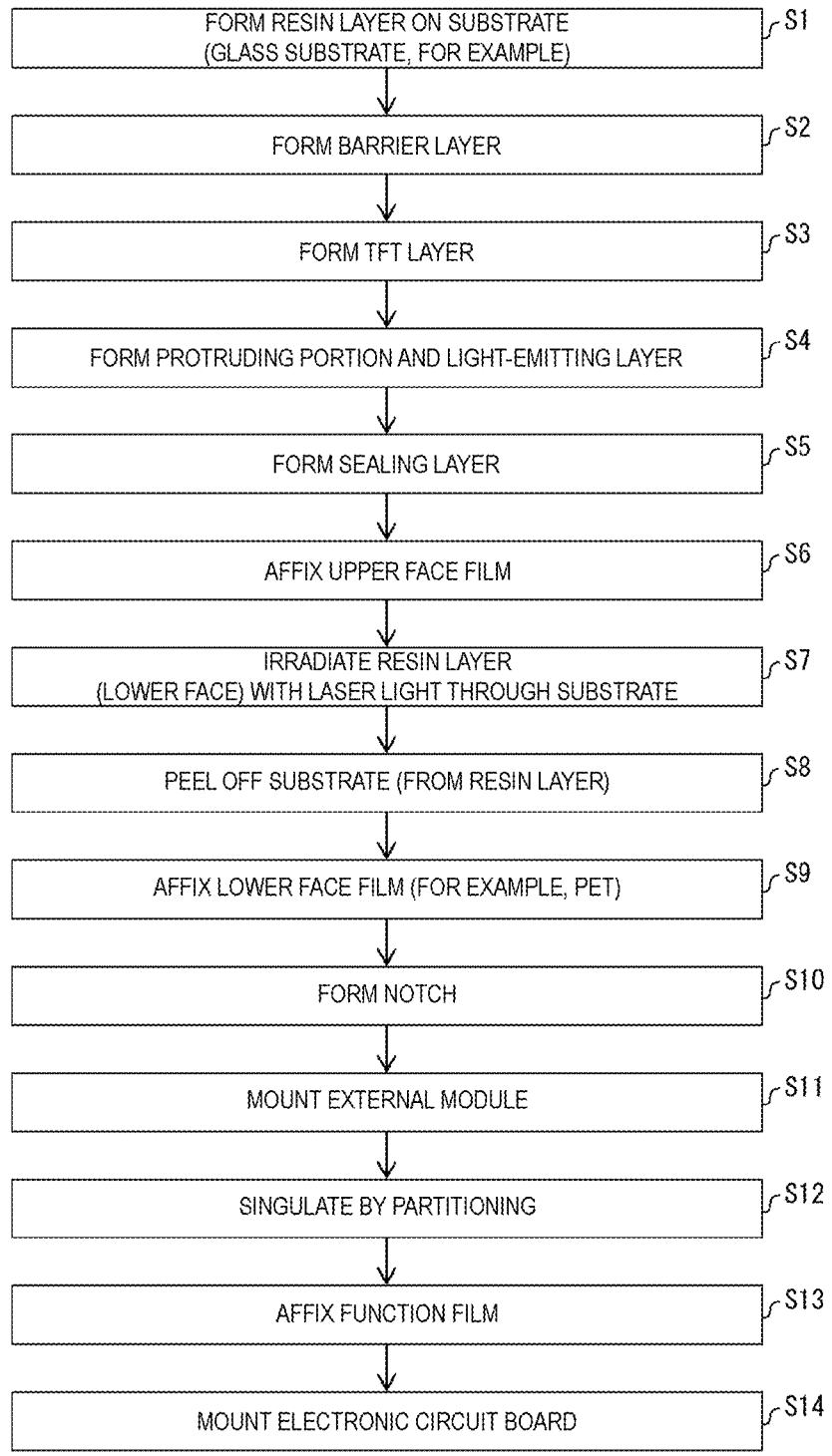
FIG. 4 is a flowchart illustrating a manufacturing process of the display device according to the first embodiment of the disclosure.
Figure 5:
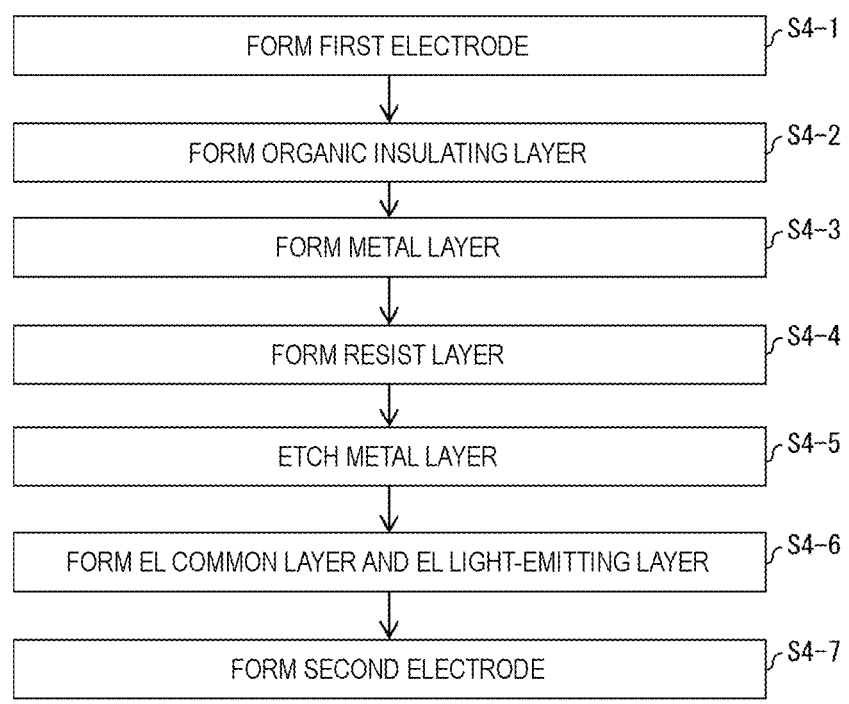
FIG. 5 is a flowchart illustrating a manufacturing process of a protruding portion and a light-emitting layer of the display device according to the first embodiment of the disclosure.

FIG. 5 is a flowchart for describing in detail formation of the protruding portion 8 and the light-emitting layer 5 indicated in step S4 in FIG. 4. The formation method of the protruding portion 8 and the light-emitting layer 5 will be described with reference to process cross-sectional views illustrated from FIG. 6A to FIG. 8B along with the flowchart in FIG. 5.

Figure 6A:
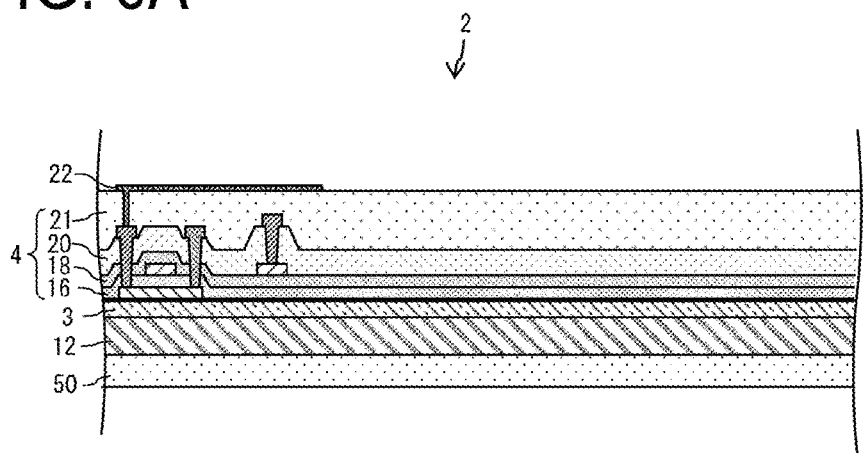
FIGS. 6A and 6B are process cross-sectional views illustrating manufacturing processes of the display device according to the first embodiment of the disclosure, in order.
Figure 6B:
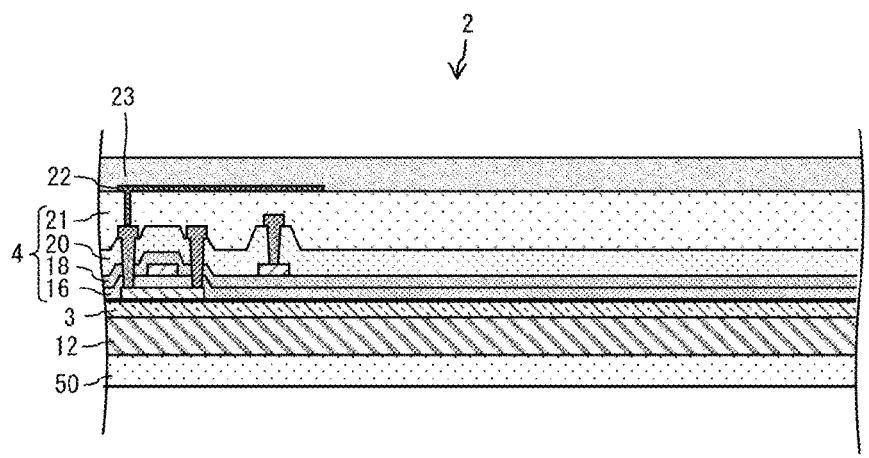

First, after formation is completed from the glass substrate 50 to the TFT layer 4, the first electrode 22 is formed as illustrated in FIG. 6A (step S4-1). At this time, the first electrode 22 is formed in a contact hole opened in the organic interlayer film 21 to ensure that conduction occurs between the first electrode 22 and the drain electrode D. Next, as illustrated in FIG. 6B, the organic insulating film 23 is applied and an opening is provided in a position overlapping the first electrode 22, forming the organic insulating film 23 illustrated in FIG. 7A (step S4-2). At this time, the organic insulating film 23 is formed so that the organic insulating film 23 covers an end face of the first electrode 22.

Figure 7A:
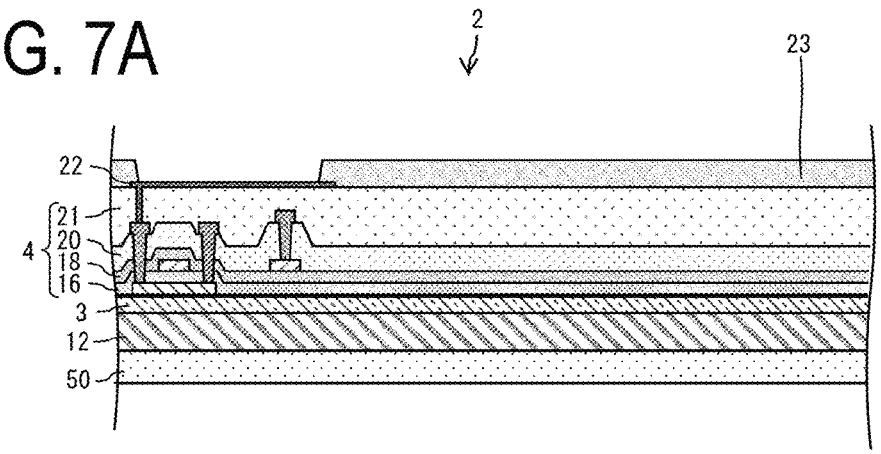
FIGS. 7A and 7B are other process cross-sectional views illustrating manufacturing processes of the display device according to the first embodiment of the disclosure, in order.
Figure 7B:
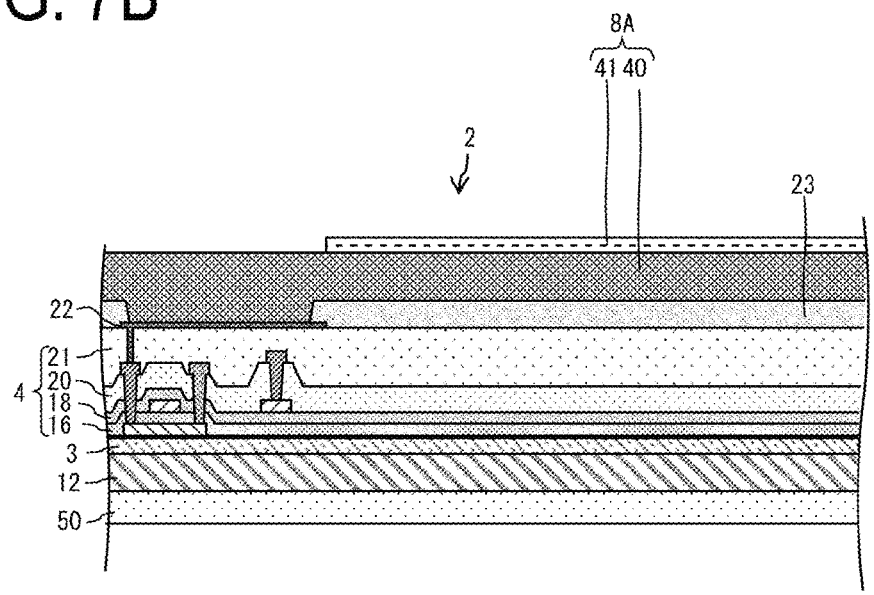

Next, the metal layer 40 is formed on the organic insulating film 23 (step S4-3), the resist layer 41 is formed on an upper layer of the metal layer 40 (step S4-4), and the resist layer 41 is patterned by photolithography over a mask. As a result, a protruding portion layer 8A illustrated in FIG. 7B is formed.

Next, the metal layer 40 is etched by isotropic etching over the resist layer 41 (step S4-5). At this time, the material used for the first electrode 22 and the metal layer 40 and the etching solution are selected to ensure that the first electrode 22 is not etched by the etching of the metal layer 40. In the present embodiment, the first electrode 22 is a Ti/Al/Ti layered body, and therefore the etching solution used is one that does not etch Ti. Furthermore, the metal layer 40 is made of a metal material that is different from Ti and is etched by the aforementioned etching solution.

Figure 8A:
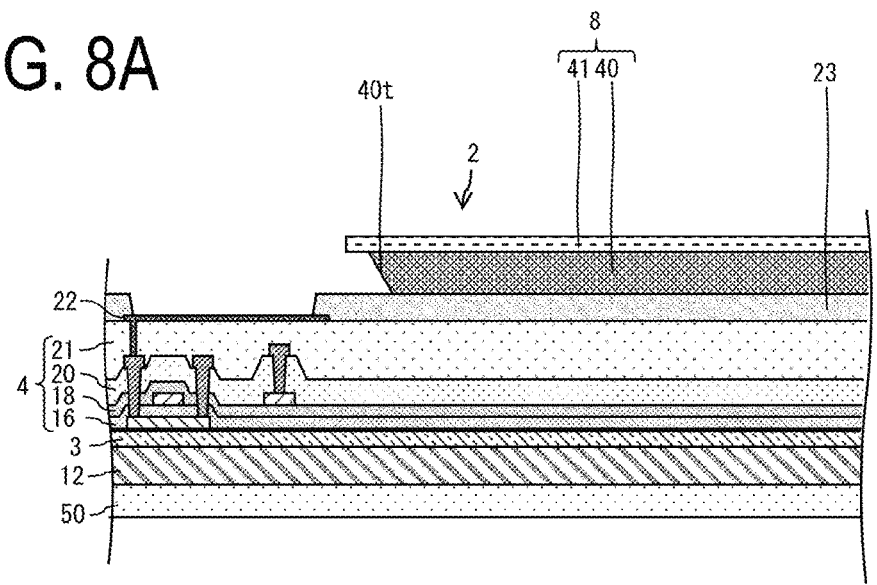
FIGS. 8A and 8B are other process cross-sectional views illustrating manufacturing processes of the display device according to the first embodiment of the disclosure, in order.

Due to the characteristics of isotropic etching, the metal layer 40 below the resist layer 41 is also partially wrapped around and etched at an end portion of the resist layer 41. With such etching of the metal layer 40 below the resist layer 41, the protruding portion 8 including on a side surface the inversely tapered face 40t illustrated in FIG. 8A is obtained.

Next, the EL light-emitting layer 24 and the EL common layer 25 are formed (step S4-6). At this time, the EL common layer 25 is formed by vapor deposition from above the display surface side of the glass substrate 50. As a result, the EL common layer 25 is not wrapped around and formed across the upper face 23t of the organic insulating film 23, which is in the shadow in a planar view, by the resist layer 41 and the inversely tapered face 40t of the protruding portion 8. Furthermore, an upper face of the organic insulating film 23 and an upper face of the protruding portion 8 differ in height from the glass substrate 50, and thus the EL common layer 25 is disconnected as a result of a step at an end portion of the protruding portion 8. As a result, the EL common layer 25 not connected with the EL common layer 25 of the active region DA is formed on an upper layer of the protruding portion 8. Accordingly, in a planar view, the end face 25t of the EL common layer 25 exists in a position overlapping the inversely tapered face 40t.

Figure 8B:
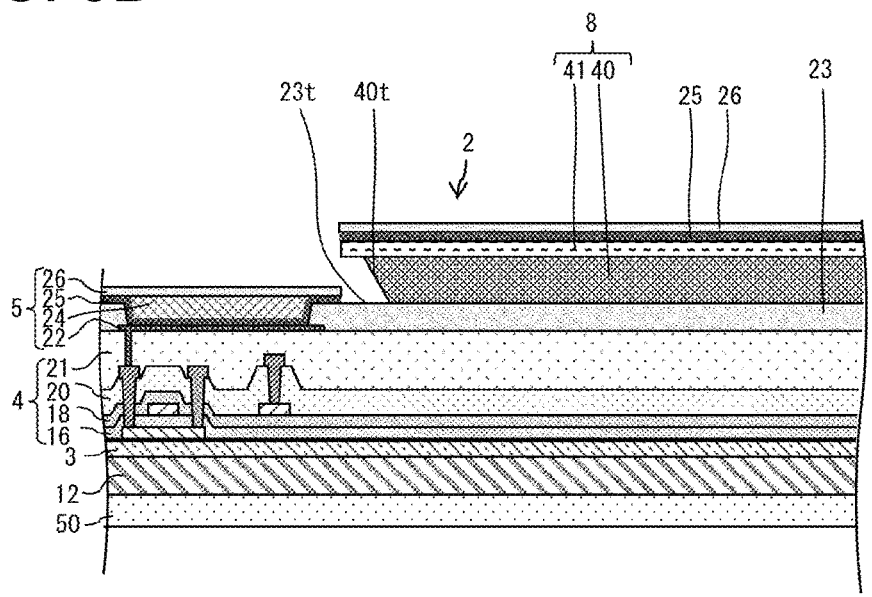

Next, the second electrode 26 is formed (step S4-7). In this step as well, similar to above, the second electrode 26 is not formed on the upper face 23t of the organic insulating film 23. Further, the disconnection of the second electrode 26 occurs as a result of a step, and the second electrode 26s not connected with the second electrode 26 in the active region DA is formed on the upper layer of the EL common layer 25s of the protruding portion 8. In this case as well, in a planar view, the end face 26t of the second electrode 26 exists in a position overlapping the inversely tapered face 40t. From the above, the light-emitting layer 5 is formed as illustrated in FIG. 8B.

Next, step S5 to step S11 illustrated in FIG. 4 will be described in more detail with reference to FIGS. 9A to 10B.

First, the sealing layer 6 is formed above the light-emitting layer 5 (step S5). The inorganic sealing film 27 serving as the lowermost layer of the sealing layer 6 is formed using CVD. As a result, the inorganic sealing film 27 is wrapped around and formed across the upper face 23t of the organic insulating film 23, which is in the shadow in a planar view, by the resist layer 41 and the inversely tapered face 40t of the protruding portion 8. Accordingly, the exposed end face 25t of the EL common layer 25 and end face 26t of the second electrode 26 are covered by the inorganic sealing film 27.

Figure 9A:
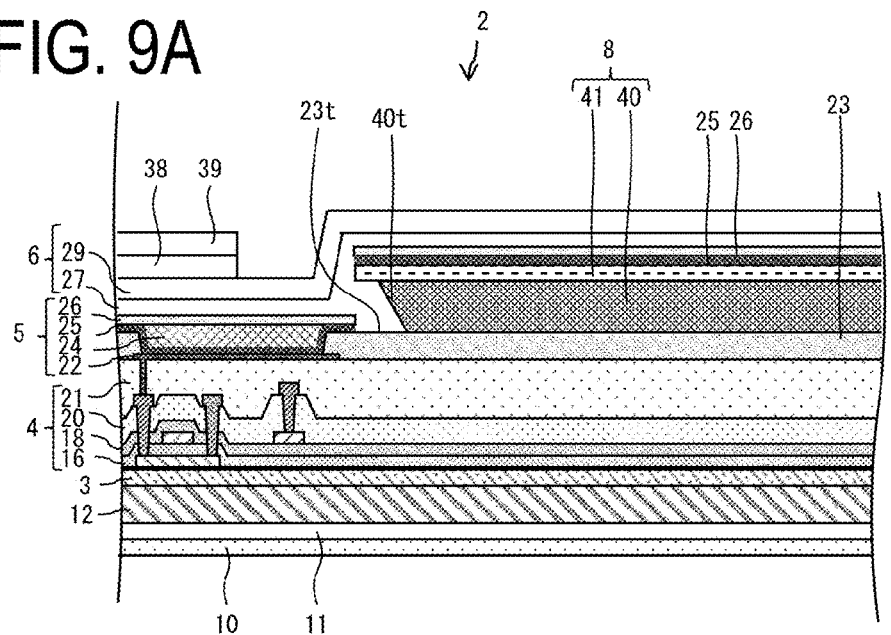
FIGS. 9A and 9B are other process cross-sectional views illustrating manufacturing processes of the display device according to the first embodiment of the disclosure, in order.
Figure 9B:
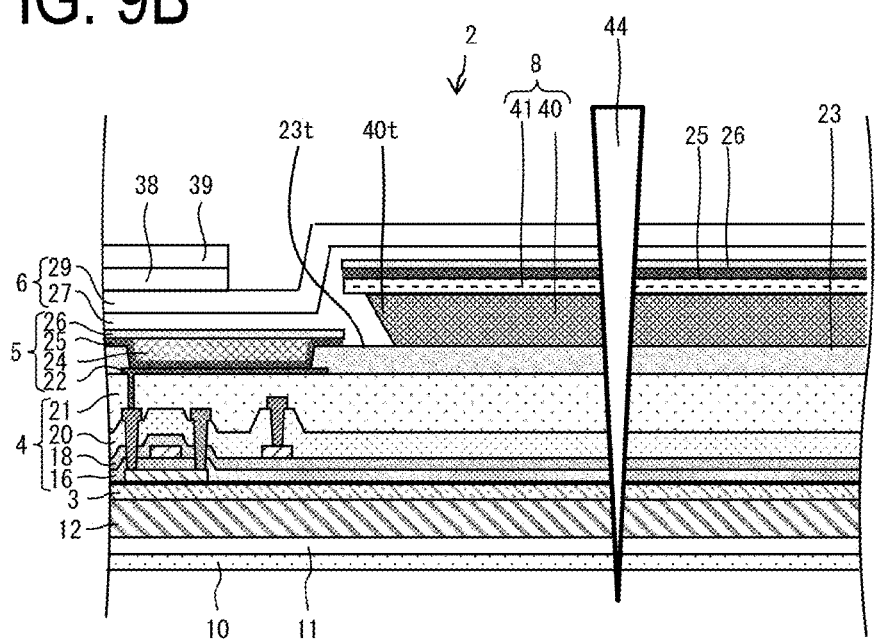

Next, step S6 to step S9 are performed. That is, the function film 39 is affixed to an upper face of the sealing layer 6 via the adhesive layer 38, the glass substrate 50 is peeled from the resin layer 12, and the base material 10 is affixed to the lower face of the resin layer 12 via the adhesive layer 11. As a result, the layered structure illustrated in FIG. 9A is obtained.

Next, the layered body including the protruding portion 8 is pierced, and the notch 9 is formed (step S6). The piercing may be performed by a laser 44 from a laser cutter illustrated in FIG. 9B or the like, for example. The laser 44 may be a femto laser, an yttrium aluminum garnet (YAG) laser, or a pulse laser. Further, when piercing is performed by the laser 44, preferably minimal heat is produced on the layered body. Furthermore, to obtain output suitable for machining each layer of the layered body, the output of the laser 44 may be changed in the middle of the piercing by the laser 44.

By the piercing, the notch 9 illustrated in FIG. 10A is obtained. As a result, the region where the protruding portion 8 is formed from the notch 9 becomes the frame region SA, and the region on the peripheral side of the protruding portion 8 becomes the active region DA. Lastly, the external module 43 is mounted on the notch 9 (step S7), and thus the structure illustrated in FIG. 10B is obtained. Subsequently, the display device 2 illustrated in FIG. 1 is obtained by executing steps S8 and thereafter.

Figure 11:
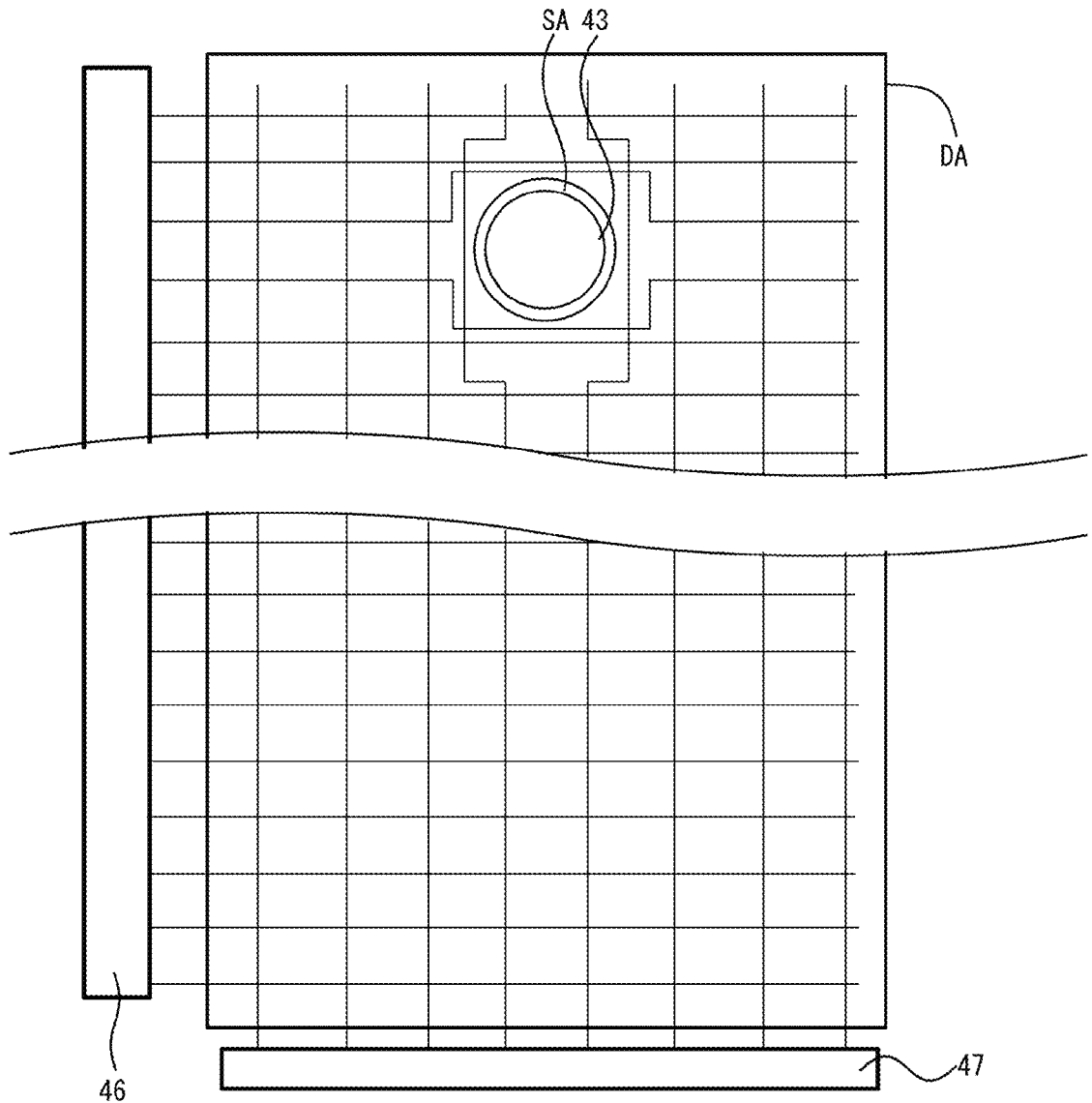
FIG. 11 is a diagram illustrating an example of a lead of an image signal line and an arrangement of a driver of the display device according to the first embodiment of the disclosure.

FIG. 11 illustrates a gate driver, a source driver, and wiring lines from the respective drivers used for driving the light-emitting element of the light-emitting layer 5. The display device 2 includes a first gate driver 46 and a first source driver 47. The first gate driver 46 and the first source driver 47 are each formed on outside the active region DA. The wiring line from the first gate driver 46 and the wiring line from the first source driver 47 are wired substantially orthogonal to each other. At this time, the wiring lines are arranged by bypassing the frame region SA and the external module 43 so that wiring is not wired in a position where the frame region SA and the external module 43 exist.

The display device 2 of the present embodiment includes the notch 9 in the active region DA, and the external module 43 is mounted in the notch 9. As a result, there is no need to separately form a region for mounting the external module 43 on the outer side of the active region DA. As a result, the area up to near the end portion of the display device 2 can serve as the active region DA, increasing the degree of design freedom of the display surface.

Further, the light-emitting layer 5 is disconnected at the protruding portion 8 as a result of a step, and the end face of the light-emitting layer 5 of the active region DA is covered by the sealing layer 6. As a result, the possibility of penetration by foreign matters such as moisture from the notch 9 into the light-emitting layer 5 of the active region DA, which is a valid layer contributing to the display, can be reduced.

Further, with formation of the protruding portion 8, the light-emitting layer 5 is disconnected as a result of a step and the shadow of the protruding portion 8 can be created at the end face of the light-emitting layer 5 by a relatively simple structure. As a result, the end face of the light-emitting layer 5 can be covered by the sealing layer 6 relatively simply.

Further, even when foreign matters penetrate the layered body of the frame region SA, the frame region SA is a region that does not contribute to the display, and thus deterioration of the display of the display device 2 is reduced.

Second Embodiment

Figure 12:
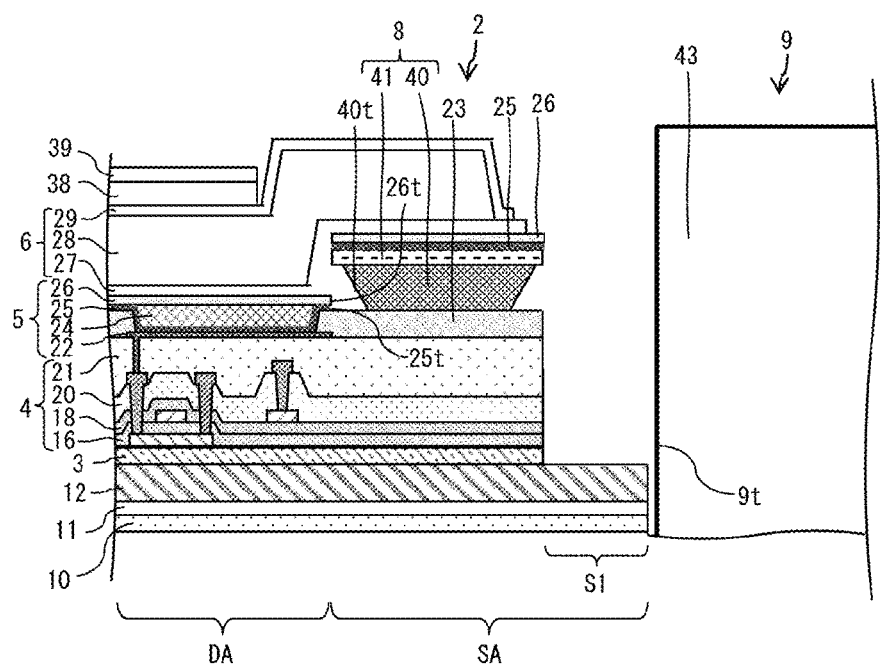
FIG. 12 is a cross-sectional side view illustrating a boundary periphery between an active region and an external module of a display device according to a second embodiment of the disclosure.

FIG. 12 illustrates a cross-sectional view of the periphery of an outer edge of an external module 43 of a display device 2 according to the present embodiment. The display device 2 according to the present embodiment, compared to the previous embodiment, differs in that a side face of the metal layer 40 includes an inverse taper even on the notch 9 side, the sealing layer 6 further includes the organic sealing film 28, and the sealing layer 6 includes an end portion on a protruding portion 8. Furthermore, the display device 2 according to the present embodiment includes a slit S1 in an inorganic layer above the base material 10 on a peripheral end of the active region DA in which the notch 9 is formed.

Figure 13:
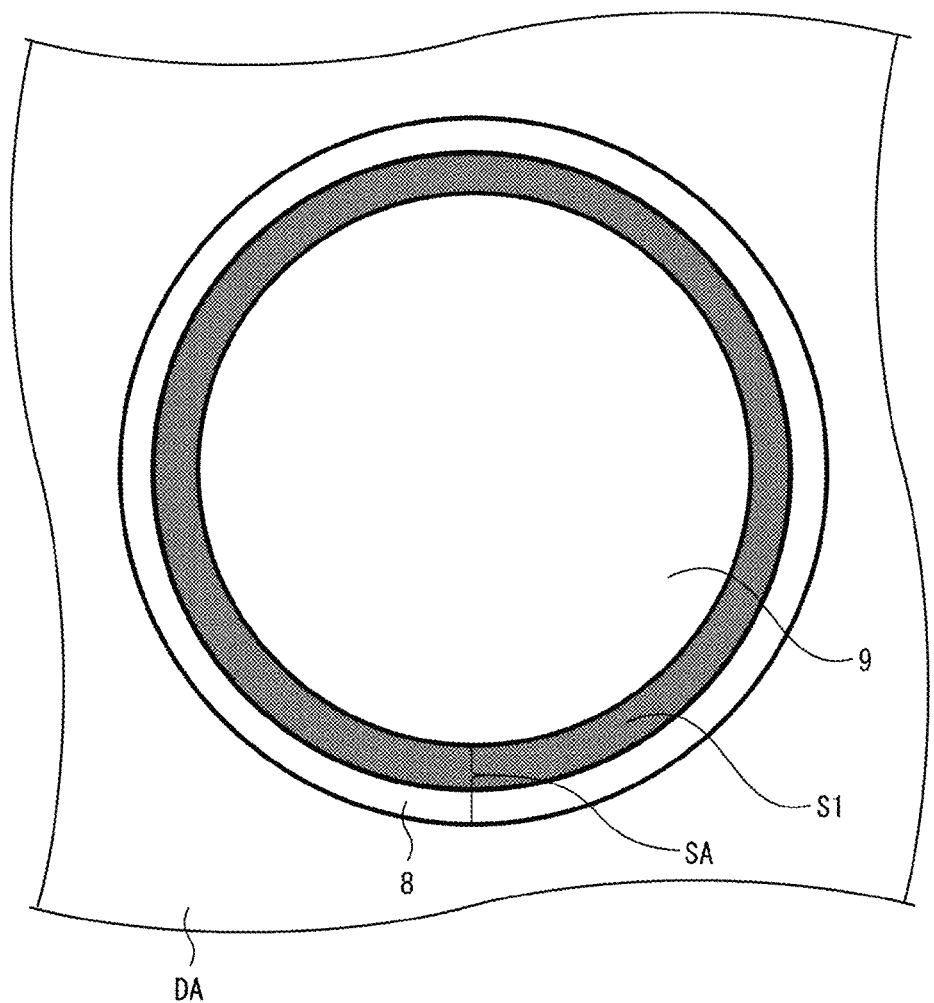
FIG. 13 is a top view illustrating a periphery of a notch 9 of the display device according to the second embodiment of the disclosure.

FIG. 13 is a general top view of the periphery of the notch 9 of the display device 2 according to the present embodiment. The protruding portion 8 and the slit S1 are formed in this order toward the notch 9, on the peripheral end of the active region DA in which the notch 9 is formed. That is, the protruding portion 8 and the slit S1 are both formed in the frame region SA surrounding the notch 9.

A manufacturing method of the display device 2 illustrated in FIG. 12 will now be described with reference to the process cross-sectional views illustrated in FIGS. 14A to 17B.

Figure 14A:
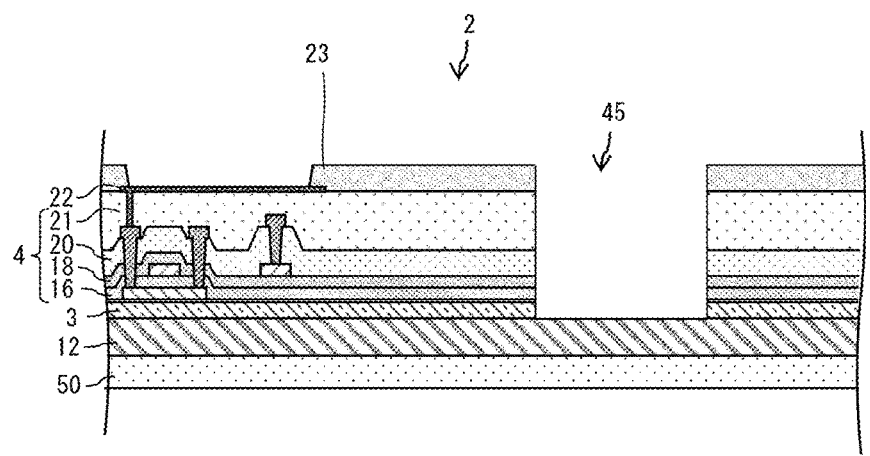
FIGS. 14A and 14B are process cross-sectional views illustrating manufacturing processes of the display device according to the second embodiment of the disclosure, in order.

First, steps through application of an organic insulating film 23 are performed in the same way as in the previous embodiment. Next, the organic insulating film 23 is patterned. At this time, the organic insulating film 23 is removed to form an opening in the position where the organic insulating film 23 overlaps an upper face of the first electrode 22. At the same time, in the present embodiment, as illustrated in FIG. 14A, an area from the barrier layer 3 to the organic insulating film 23 is removed and a recessed portion 45 is formed in a portion of a layered body where the first electrode 22 is not formed.

Figure 14B:
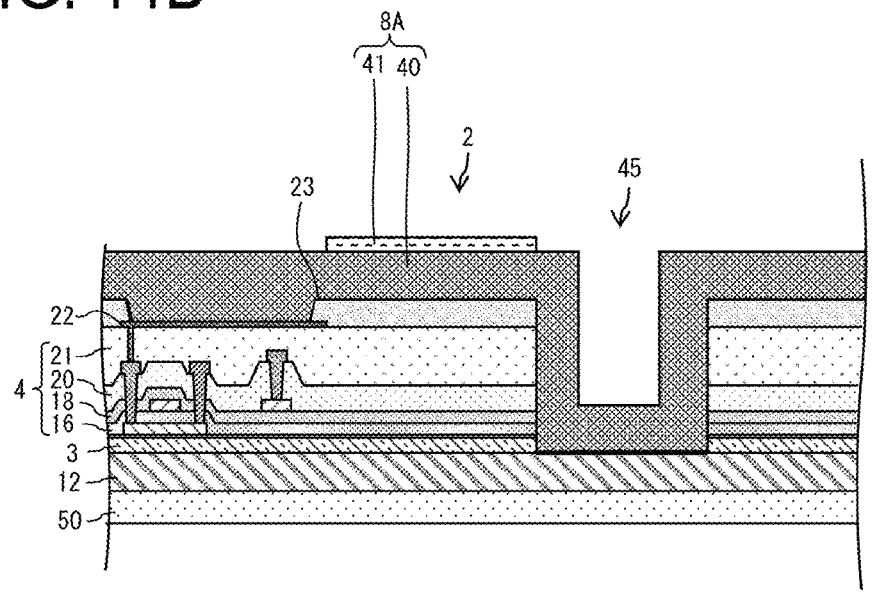
Figure 15A:
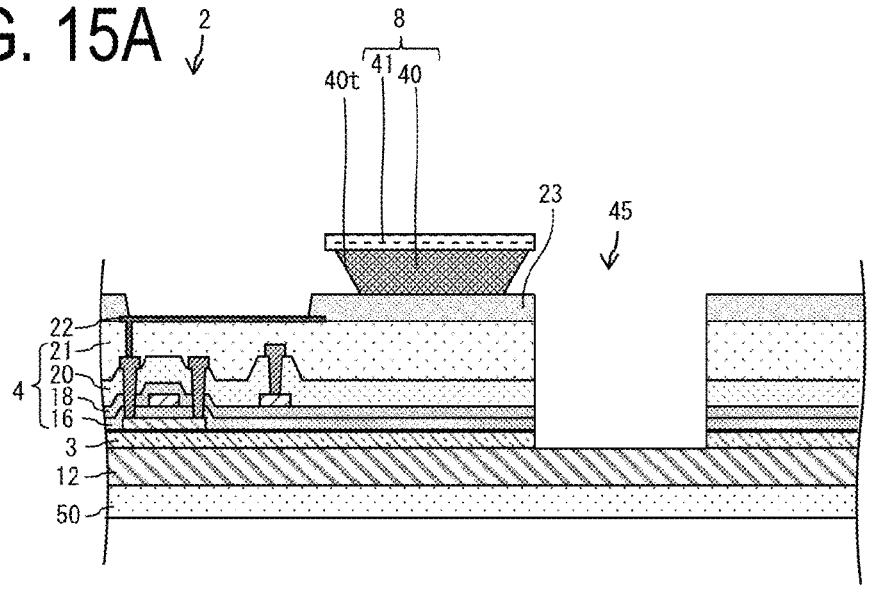
FIGS. 15A and 15B are other process cross-sectional views illustrating manufacturing processes of the display device according to the second embodiment of the disclosure, in order.

Next, the metal layer 40 and the resist layer 41 are formed, and the resist layer 41 is patterned by photolithography over a mask. A protruding portion layer 8A illustrated in FIG. 14B is formed. Next, the metal layer 40 is etched by isotropic etching over the resist layer 41, and the inversely tapered face 40t illustrated in FIG. 15A is obtained. At this time, since the resist layer 41 is not formed in an upper area of the recessed portion 45, the metal layer 40 does not exist in the recessed portion 45, and an inverse taper is formed on an end face on the recessed portion 45 side as well.

Figure 15B:
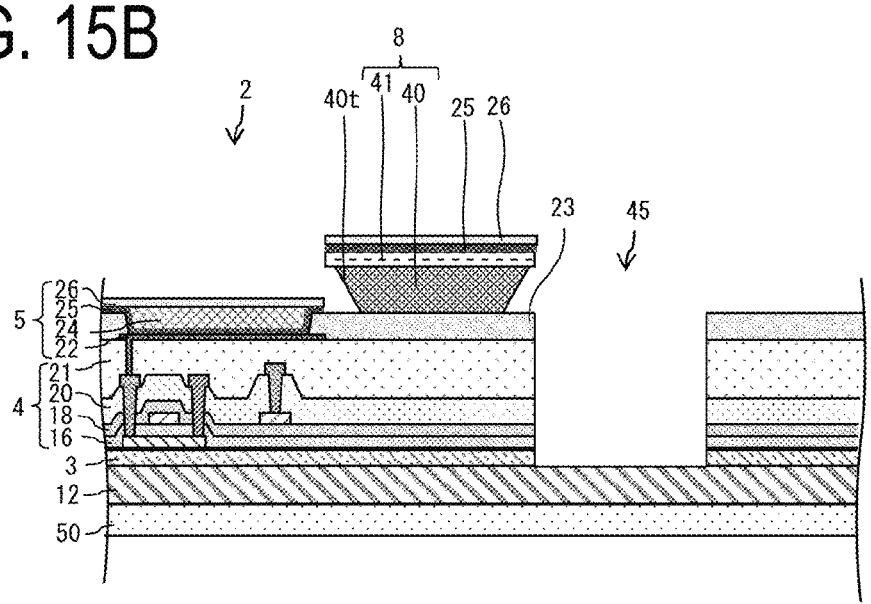

Next, the EL light-emitting layer 24 and the EL common layer 25 are formed by vapor deposition, and the light-emitting layer 5 is formed. At this time, in the present embodiment, the shape of a mask used in vapor deposition is designed, and thus the EL light-emitting layer 24 and the EL common layer 25 are not formed in the recessed portion 45, as illustrated in FIG. 15B. Nevertheless, the EL light-emitting layer 24 and the EL common layer 25 may be formed in the recessed portion 45 using a mask similar to that in the previous embodiment.

Figure 16A:
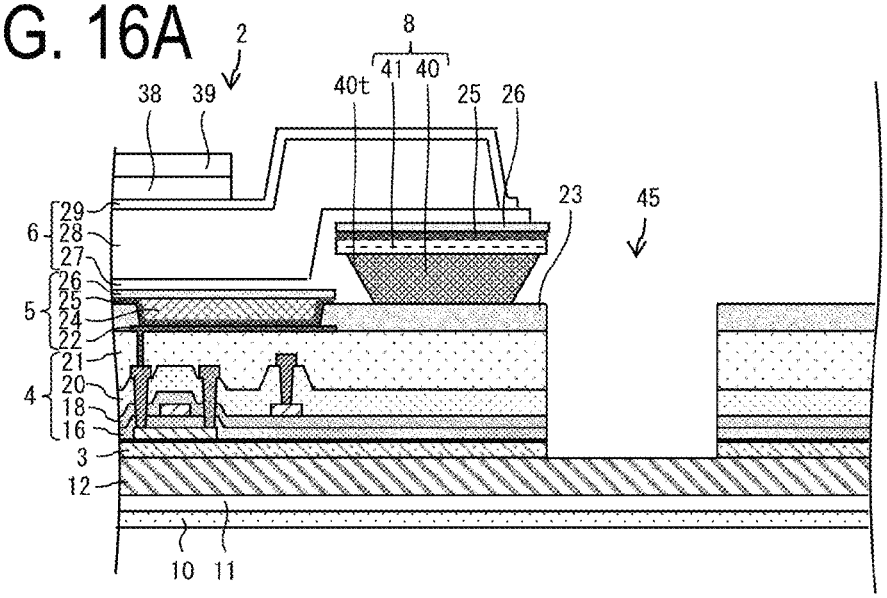
FIGS. 16A and 16B are other process cross-sectional views illustrating manufacturing processes of the display device according to the second embodiment of the disclosure, in order.

Next, the sealing layer 6 is formed on an upper layer of the light-emitting layer 5. In the present embodiment, the organic sealing film 28 may be formed between inorganic sealing films 27, 29. The organic sealing film 28 functions as a buffer layer of the inorganic sealing film 29. At this time, the sealing layer 6 is formed so as to terminate on the light-emitting layer 5 on the protruding portion 8. As a result, as illustrated in FIG. 16A, the sealing layer 6 is not formed in the recessed portion 45. Furthermore, the inorganic sealing film 29 covers an end face of the organic sealing film 28, and the inorganic sealing film 29 comes into contact with the inorganic sealing film 27. As a result, penetration of foreign matters into the active region DA side from the end face of the organic sealing film 28 can be reduced.

Figure 16B:
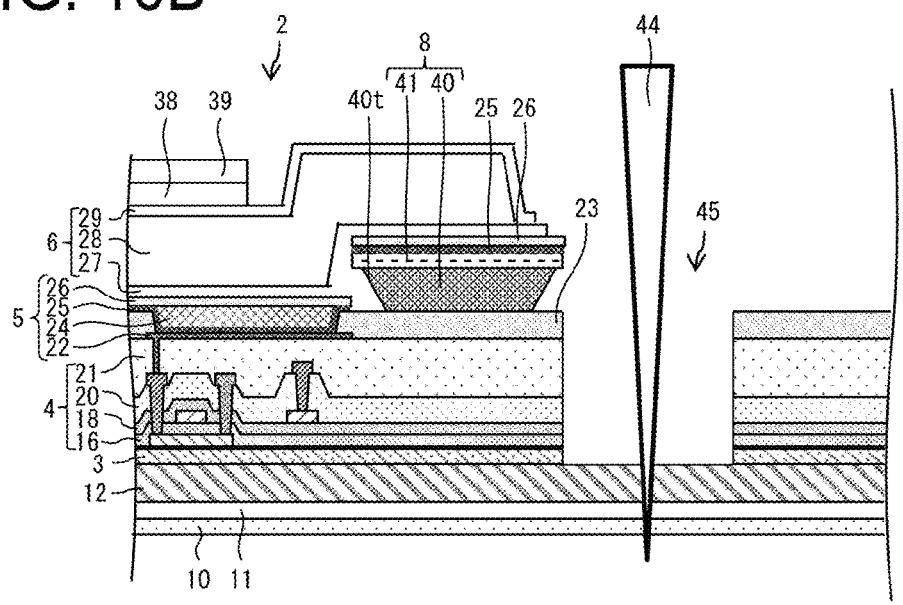
Figure 17A:
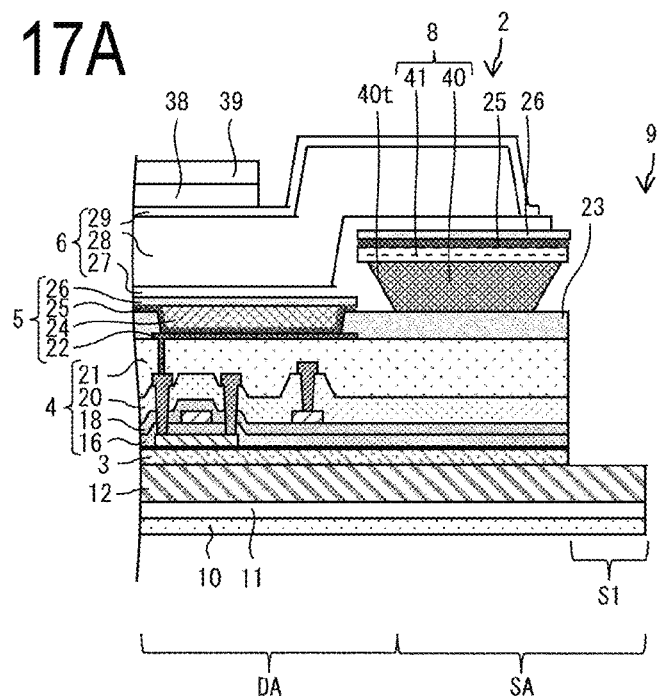
FIGS. 17A and 17B are other process cross-sectional views illustrating manufacturing processes of the display device according to the second embodiment of the disclosure, in order.
Figure 17B:
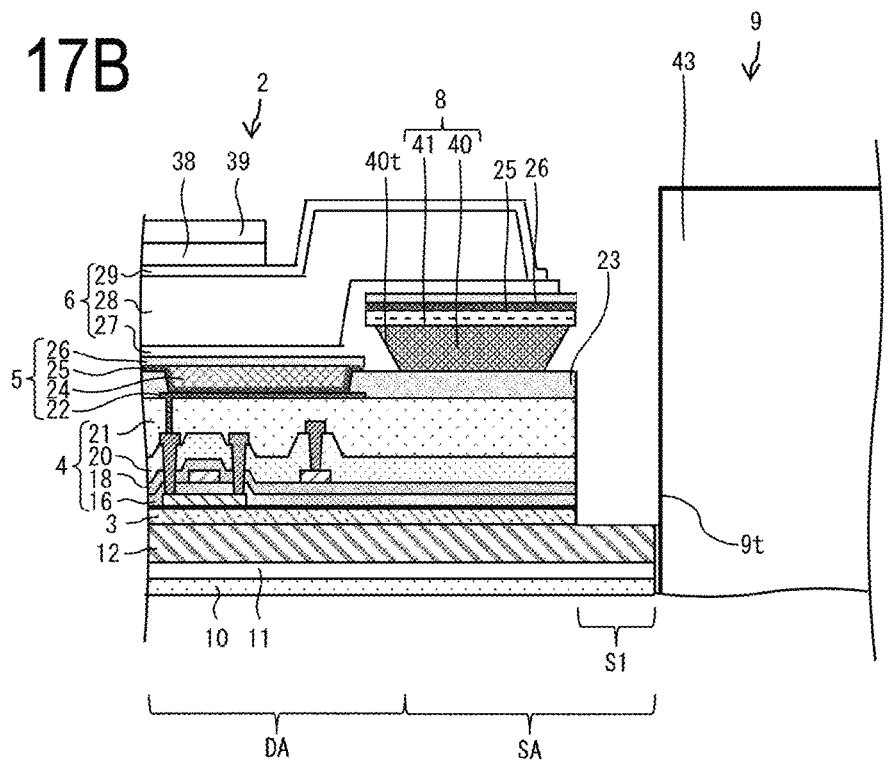

Next, to form the notch 9, the layered body is pierced by the laser 44 or the like. In the present embodiment, as illustrated in FIG. 16B, only a resin layer 12, which is an organic layer exposed in the recessed portion 45, and the glass substrate 50, which is a base material, are pierced to form the notch 9 illustrated in FIG. 17A. At this time, as illustrated in FIG. 17A, a slit S1 in an inorganic layer above the glass substrate 50 is formed. Next, as illustrated in FIG. 17B, an external module 43 is mounted on the notch 9 and, similar to the previous embodiment, the display device 2 illustrated in FIG. 12 is obtained by executing steps S8 and thereafter.

In the display device 2 according to the present embodiment, when the notch 9 is formed, the glass substrate 50 serving as the base material, and the resin layer 12 serving as the organic layer above the glass substrate 50 are pierced. That is, when the notch 9 is formed, the organic layer above the glass substrate 50 is not pierced. As a result, when the notch 9 is formed, the possibility of crack occurrence by the piercing of the inorganic layer can be reduced.

Third Embodiment

Figure 18:
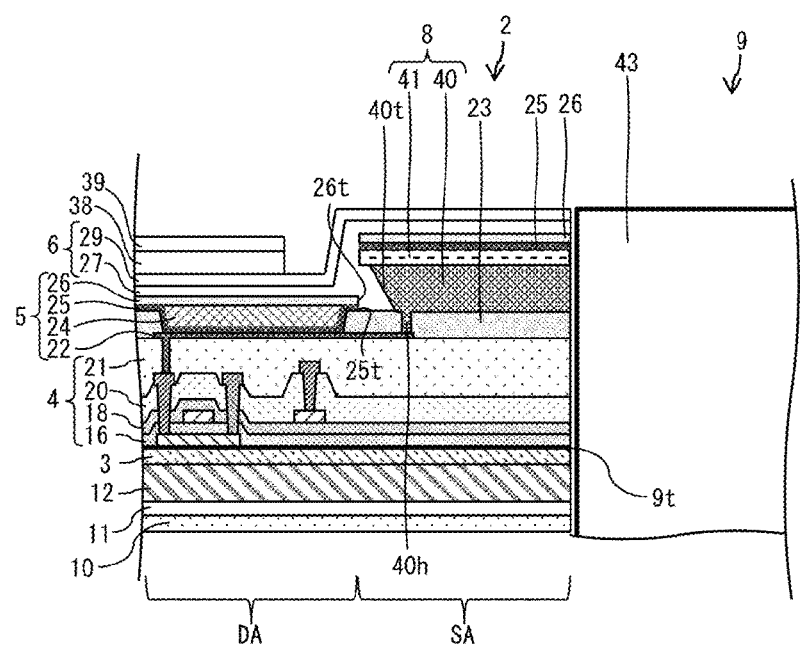
FIG. 18 is a cross-sectional side view illustrating a boundary periphery of an active region and an external module of a display device according to a third embodiment of the disclosure.

FIG. 18 illustrates a cross-sectional view of the periphery of an outer edge of an external module 43 of a display device 2 according to the present embodiment. The display device 2 according to the present embodiment, compared to the first embodiment, differs only in that the first electrode 22 and the metal layer 40 are electrically conducted in a contact portion 40h. A manufacturing method of the display device 2 illustrated in FIG. 18 will now be described with reference to process cross-sectional views illustrated in FIGS. 19A and 19B.

Figure 19A:
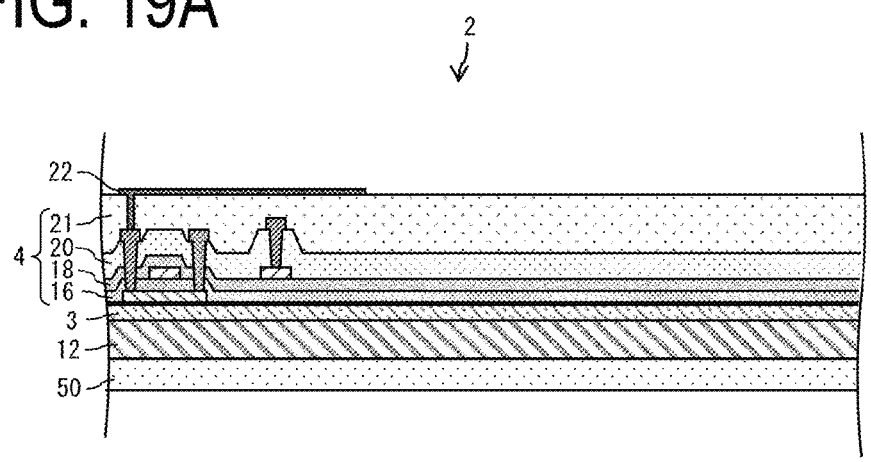
FIGS. 19A and 19B are process cross-sectional views illustrating manufacturing processes of the display device according to the third embodiment of the disclosure, in order.
Figure 19B:
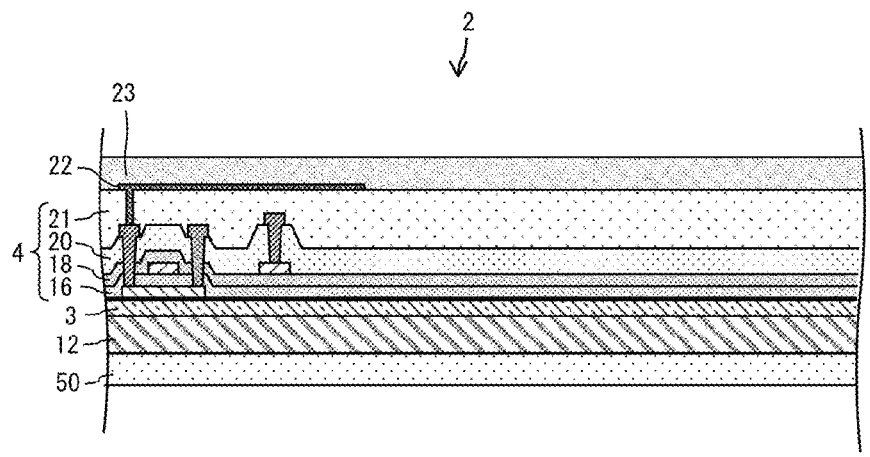
Figure 20A:
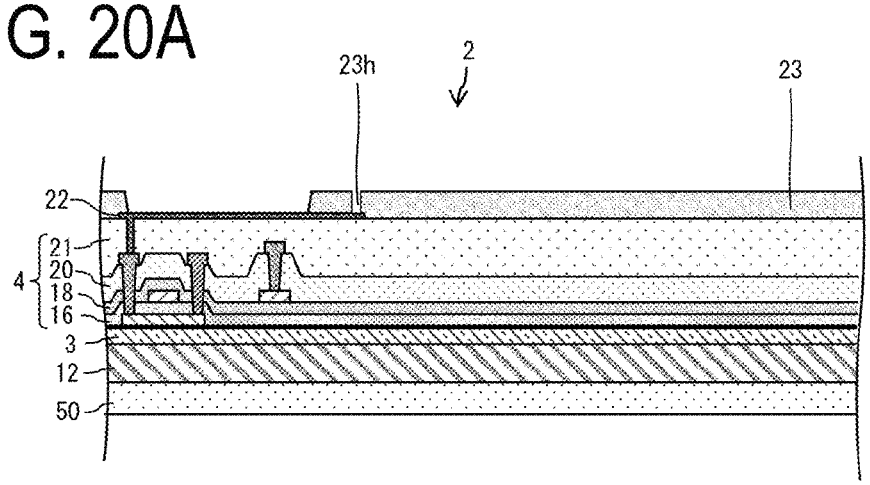
FIGS. 20A and 20B are other process cross-sectional views illustrating manufacturing processes of the display device according to the third embodiment of the disclosure, in order.

First, as illustrated in FIGS. 19A and 19B, the first electrode 22 is formed and processes through formation of the organic insulating film 23 are completed. At this time, compared to the embodiments described above, the first electrode 22 is more largely formed on a side where the external module 43 is mounted. Next, in the patterning of the organic insulating film 23, the organic insulating film 23 is partially removed in a position overlapping an upper face of the first electrode 22 as well as in a position overlapping an upper face on an end portion on the side where the external module 43 is mounted. As a result, the contact hole 23h is formed in addition to an opening where an EL light-emitting layer 24 is formed in a position overlapping the upper face of the first electrode 22, as illustrated in FIG. 20A.

Figure 20B:
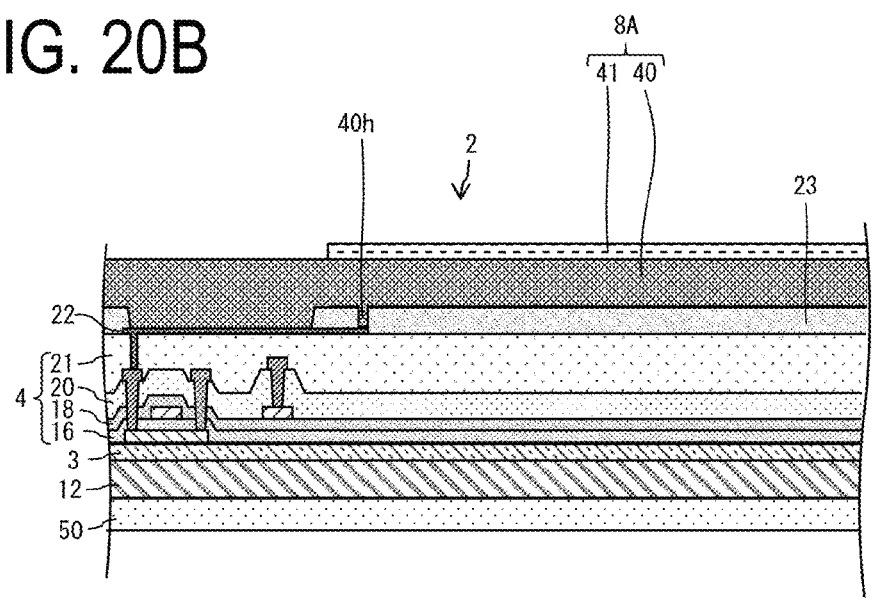

Next, a protruding portion layer 8A is formed. Here, as illustrated in FIG. 20B, the metal layer 40 is formed in the contact hole 23h as well, and thus the contact portion 40h for electrically conducting the first electrode 22 and the metal layer 40 is formed. Subsequently, the display device 2 illustrated in FIG. 18 is obtained by executing steps S4-5 and thereafter illustrated in FIG. 5, and steps S5 and thereafter illustrated in FIG. 4 in the same way as in the embodiments described above.

In the display device 2 according to the present embodiment, the first electrode 22 and the metal layer 40 are electrically conducted. As a result, the metal layer 40 can be used as an auxiliary terminal for applying voltage to the first electrode 22. Furthermore, a contact hole is formed on an upper layer of the metal layer as well, making it possible to electrically conduct the second electrode 26 and the metal layer 40. According to the configuration described above, the second electrode 26 of the protruding portion 8 can be used as an auxiliary terminal for applying voltage to the first electrode 22.

Fourth Embodiment

Figure 21:
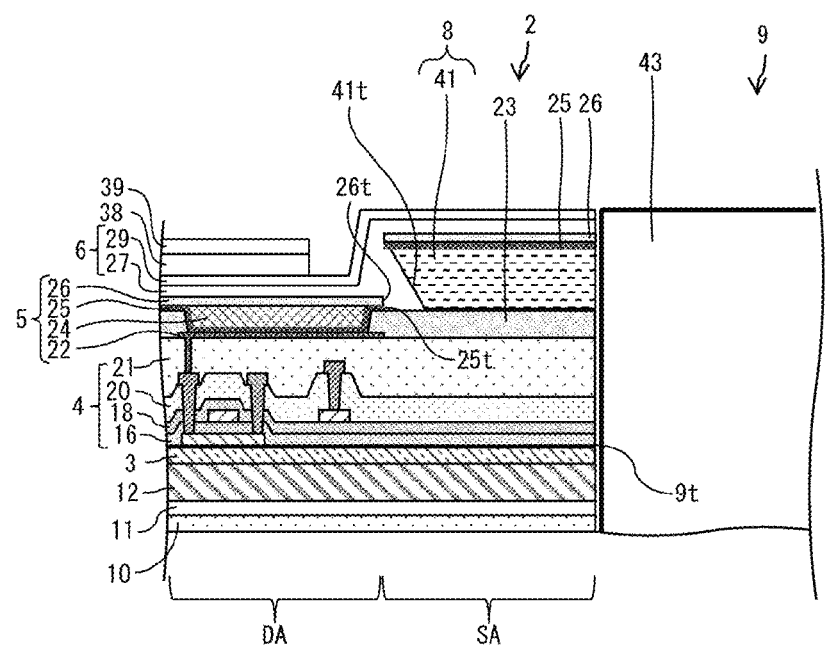
FIG. 21 is a cross-sectional side view illustrating a boundary periphery of an active region and an external module of a display device according to a fourth embodiment of the disclosure.

FIG. 21 illustrates a cross-sectional view of the periphery of an outer edge of an external module 43 of a display device 2 according to the present embodiment. The display device 2 according to the present embodiment, compared to the first embodiment, differs only in that the protruding portion 8 includes only the resist layer 41, and the inversely tapered face 41t is included on, among side faces of the resist layer 41, a side face close to an active region DA. The inversely tapered face 41t inclines to a side facing a notch 9, from a display surface toward the base material 10. Furthermore, in the present embodiment, the resist layer 41 includes a negative-working photosensitive resin. The manufacturing method of the display device 2 illustrated in FIG. 21 will now be described with reference to the process cross-sectional views illustrated in FIGS. 22A to 23B.

Figure 22A:
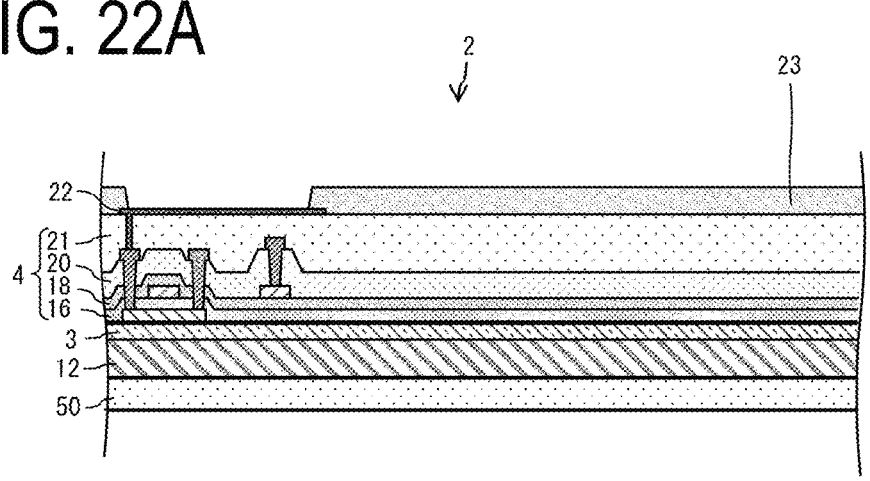
FIGS. 22A and 22B are process cross-sectional views illustrating manufacturing processes of the display device according to the fourth embodiment of the disclosure, in order.
Figure 22B:
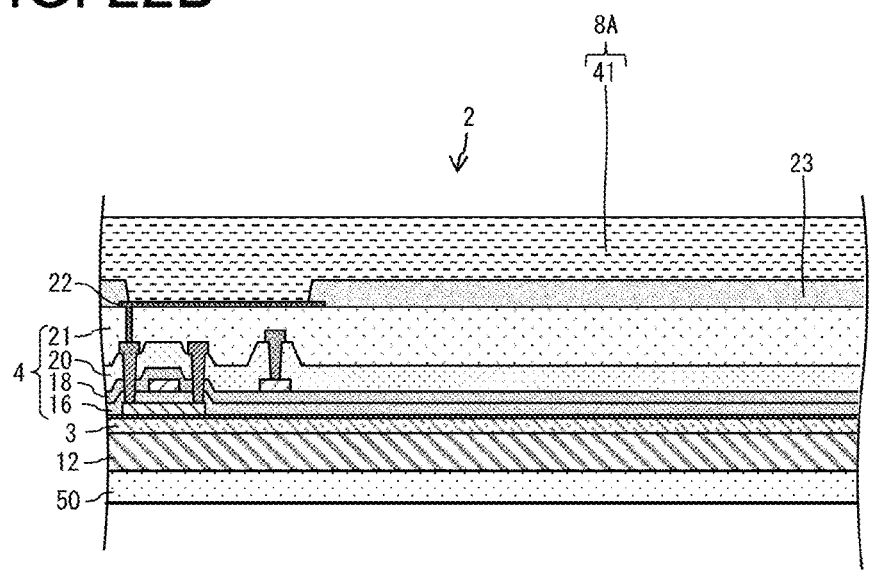

First, as illustrated in FIG. 22A, the organic insulating film 23 is formed and processes through patterning are completed. Next, as illustrated in FIG. 22B, the resist layer 41 is applied to upper layers of the organic insulating film 23 and the first electrode 22. In this state, the resist layer 41 is exposed and washed by a developing solution over a mask in which a hole is formed in only a position where the notch 9 and a frame region SA are ultimately provided, thereby developing the resist layer 41.

Figure 23A:
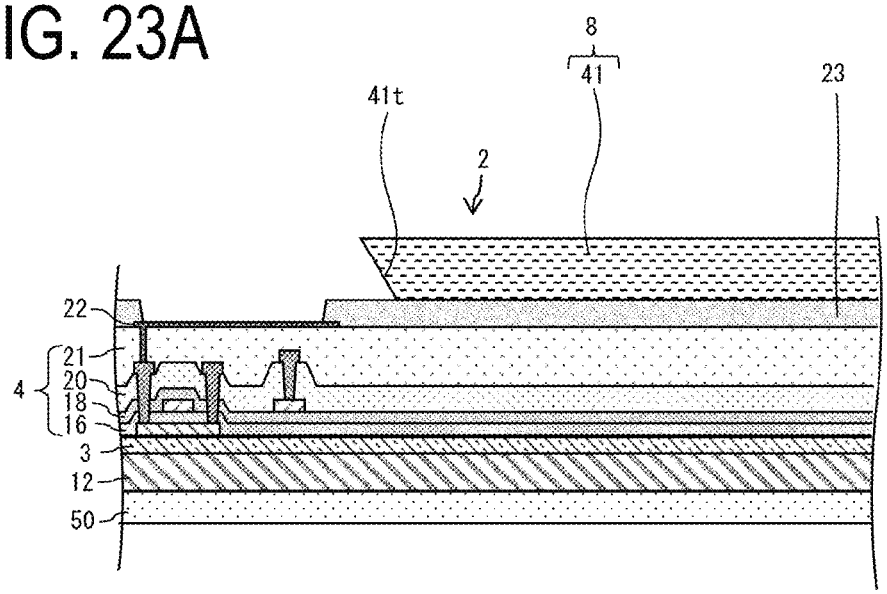
FIGS. 23A and 23B are other process cross-sectional views illustrating manufacturing processes of the display device according to the fourth embodiment of the disclosure, in order.

At this time, when the resist layer 41 is exposed from above the mask, the amount of exposure decreases increasingly toward the downward side. Thus, with the resist layer 41 including the negative-working photosensitive resin, the inversely tapered face 41t illustrated in FIG. 23A is formed after development in the resist layer 41 near the end portion of the mask.

Figure 23B:
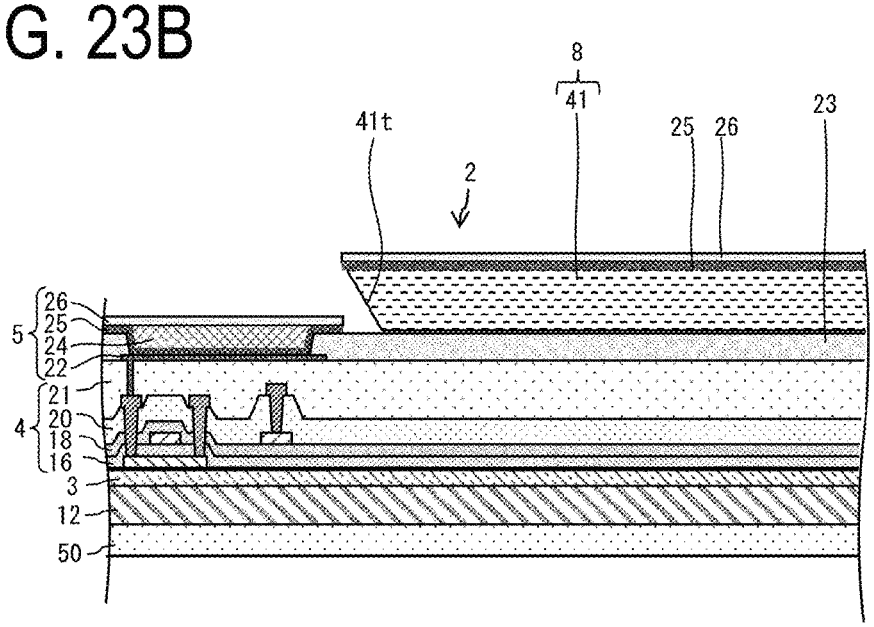

From this state, the EL light-emitting layer 24, the EL common layer 25, and the second electrode 26 are formed and thus, similar to the embodiments described above, the light-emitting layer 5 illustrated in FIG. 23B is obtained. Subsequently, the display device 2 illustrated in FIG. 21 is obtained by executing steps S5 and thereafter illustrated in FIG. 4 in the same way as in the embodiments described above.

The display device 2 according to the present embodiment can be obtained using the same configuration as in the embodiments described above with the member of the protruding portion 8 serving as the resist layer 41 only. As a result, processes related to formation and etching of the metal layer 40 can be reduced, leading to a reduction in manufacturing cost and takt time.

Fifth Embodiment

Figure 24:
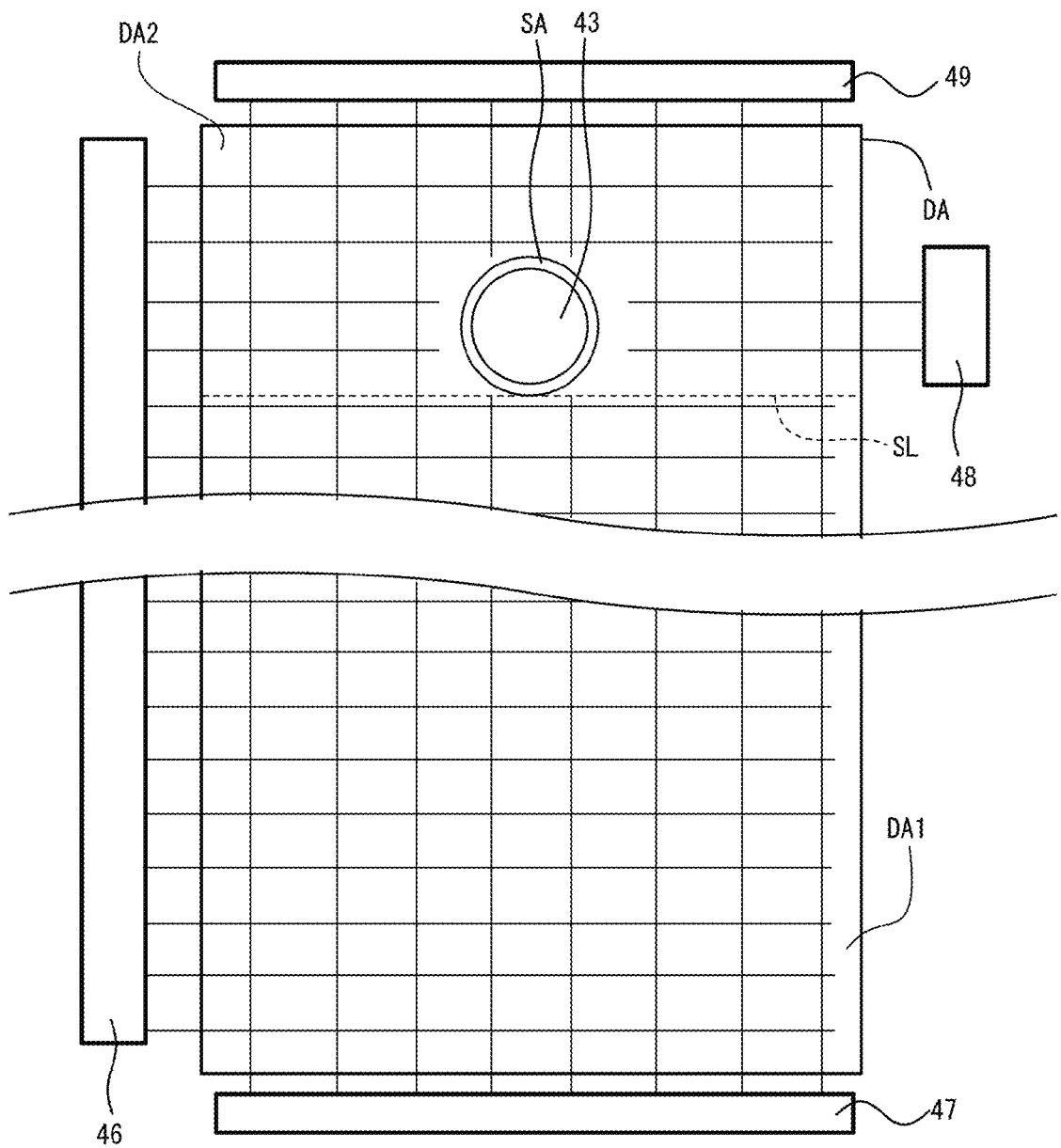
FIG. 24 is a diagram illustrating an example of the lead of an image signal line and the arrangement of a driver of a display device according to a fifth embodiment of the disclosure.

FIG. 24 illustrates a gate driver, a source driver, and wiring lines from the respective drivers used for driving a light-emitting element of a light-emitting layer 5 in a display device 2 of the present embodiment. The display device 2 of the present embodiment, compared to the display device 2 of the first embodiment, differs in including a first gate driver 46 and a second gate driver 48 as the gate driver. Further, the display device 2 of the present embodiment, compared to the display device 2 of the first embodiment, also differs in including a first source driver 47 and a second source driver 49 as the source driver.

The second gate driver 48 is disposed on a side opposite to the first gate driver 46, sandwiching an external module 43, in an active region DA. Further, the second source driver 49 is disposed on a side opposite to the first source driver 47, sandwiching the external module 43, in the active region DA.

Similar to the previous embodiments, the wiring line from the first gate driver 46 and the wiring line from the first source driver 47 are wired substantially orthogonal to each other. Here, in the present embodiment, the wiring line arranged from the first gate driver 46 toward the frame region SA and the external module 43 is formed to the area in front of the frame region SA, without bypassing the frame region SA. The wiring line from the second gate driver 48 is arranged in a position where the wiring line from the first gate driver 46 is not arranged.

On the other hand, the wiring line arranged from the first source driver 47 toward the frame region SA and the external module 43 is formed to the area in front of the frame region SA, without bypassing the frame region SA. Additionally, even the wiring line arranged from the first source driver 47 where the frame region SA and the external module 43 do not exist as an extension is arranged to the area in front of a display split line SL indicated by a dashed line in the active region DA. The wiring line from the second source driver 49 is arranged in a position where the wiring line from the first source driver 47 is not arranged. The display split line SL in FIG. 24 is substantially parallel with one side of the display surface of the display device 2, and the display split line SL indicates a position that passes through a lower end of the frame region SA. With the display split line SL as a boundary, the active region DA is split into a first active region DA1 on a lower side, and a second active region DA2 on an upper side. Note that the position of the display split line SL may be changed to a position that passes through a center of the external module 43, or the like.

In the present embodiment, the source drivers driving the light-emitting element in the respective positions, with the position of the display split line SL in the active region DA serving as reference, are different. Furthermore, image signals transmitted in the wiring line from the first source driver 47 and the wiring line from the second source driver 49 are different. As a result, the display device 2 can execute different displays in the first active region DA1 and the second active region DA2. Note that the same drive signal may be transmitted from the first gate driver 46 and the second gate driver 48 to the wiring lines respectively arranged toward the frame region SA and the external module 43.

According to the configuration described above, in the display device 2 according to the present embodiment, the wiring line is formed without bypassing the frame region SA and the external module 43, making the design of the wiring line easier. Further, the displays can be made different using the position of the external module 43, that is, the position of the notch 9, as reference, making it possible to design a more effective display surface.

Sixth Embodiment

Figure 25:
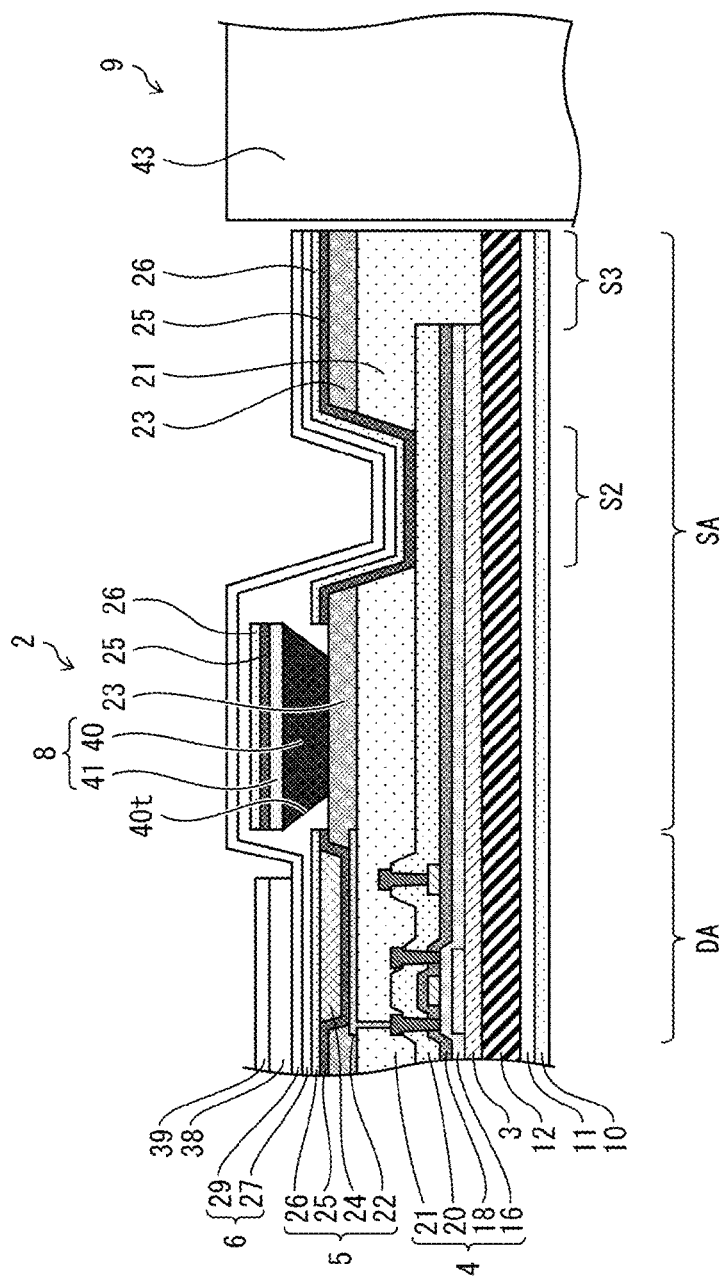
FIG. 25 is a cross-sectional side view illustrating a boundary periphery between an active region and an external module of a display device according to a sixth embodiment of the disclosure.
Figure 26:
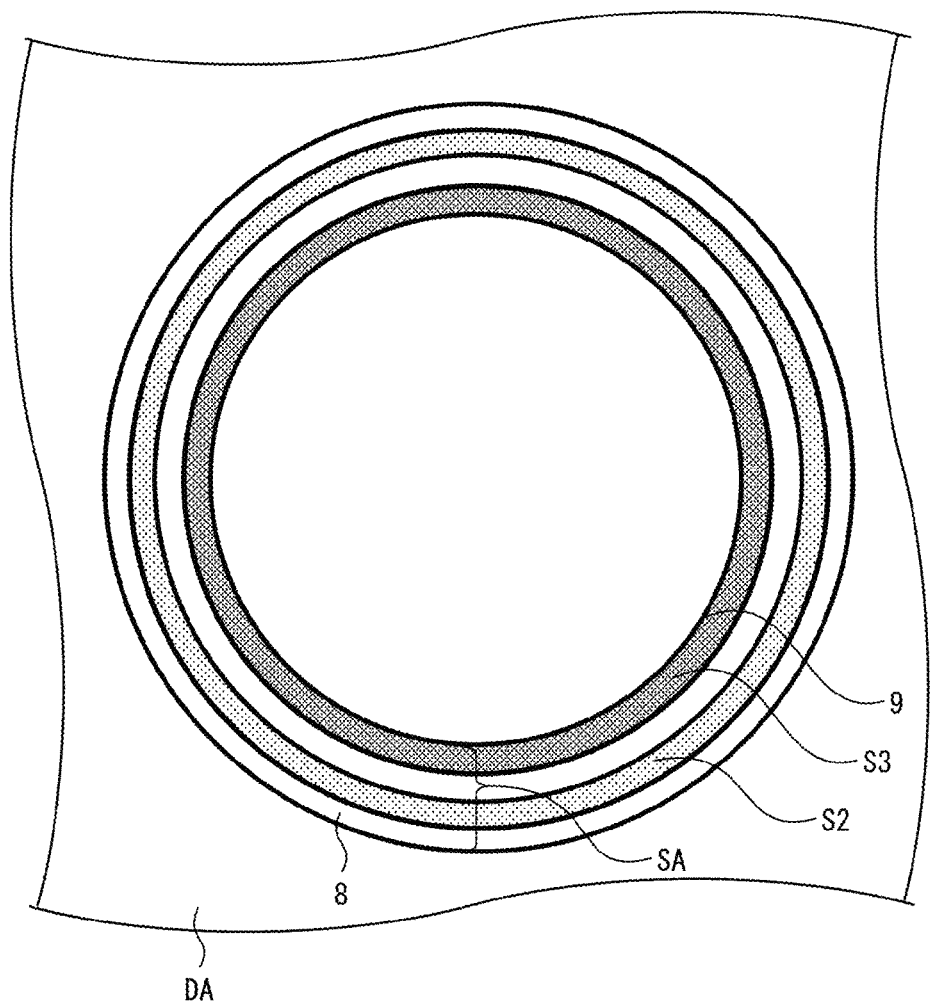
FIG. 26 is a top view illustrating the periphery of a notch 9 of the display device according to the sixth embodiment of the disclosure.

FIG. 25 illustrates a cross-sectional view of the periphery of an outer edge of an external module 43 of a display device 2 according to the present embodiment. FIG. 26 is a general top view of the periphery of a notch 9 of the display device 2 according to the present embodiment.

The display device 2 according to the present embodiment includes a slit S2 of the organic interlayer film 21 and the organic insulating film 23, between the protruding portion 8 and the notch 9 in the frame region SA. Further, the display device 2 according to the present embodiment includes a slit S3 of the barrier layer 3 and the inorganic insulating film including the passivation films 18, 20 and the gate insulating film 16 of the TFT layer 4, between the slit S2 and the notch 9.

The slit S3 is formed by removing a layer above the barrier layer 3 in a portion on a peripheral side of the active region DA when patterning the passivation film 20 in step S3 in FIG. 4. The slit S2 is formed by removing the organic interlayer film 21 and the organic insulating film 23 in a portion between the active region DA and the slid S3 when patterning the organic insulating film 23 in step S4-2 in FIG. 5.

A light-emitting layer 5 and a sealing layer 6 are formed above the slits S2, S3. Further, the organic interlayer film 21 and the organic insulating film 23 are formed between the resin layer 12 and the light-emitting layer 5, on the slit S3. In the present embodiment, the notch 9 is formed by piercing a layered body in the position of the slit S3.

The display device 2 according to the present embodiment includes the slit S2 between the protruding portion 8 and the notch 9. In the slit S2, the organic interlayer film 21 and the organic insulating film 23 are each cut. As a result, it is possible to reduce the foreign matters that penetrate the active region DA from the notch 9 through the organic interlayer film 21 or the organic insulating film 23.

Further, in the present embodiment, the notch 9 is formed by piercing the layered body in the position of the slit S3. As a result, the inorganic layers pierced when the notch 9 is formed can be reduced, making it possible to reduce the possibility of crack occurrence at the time of piercing.

Seventh Embodiment

Figure 27:
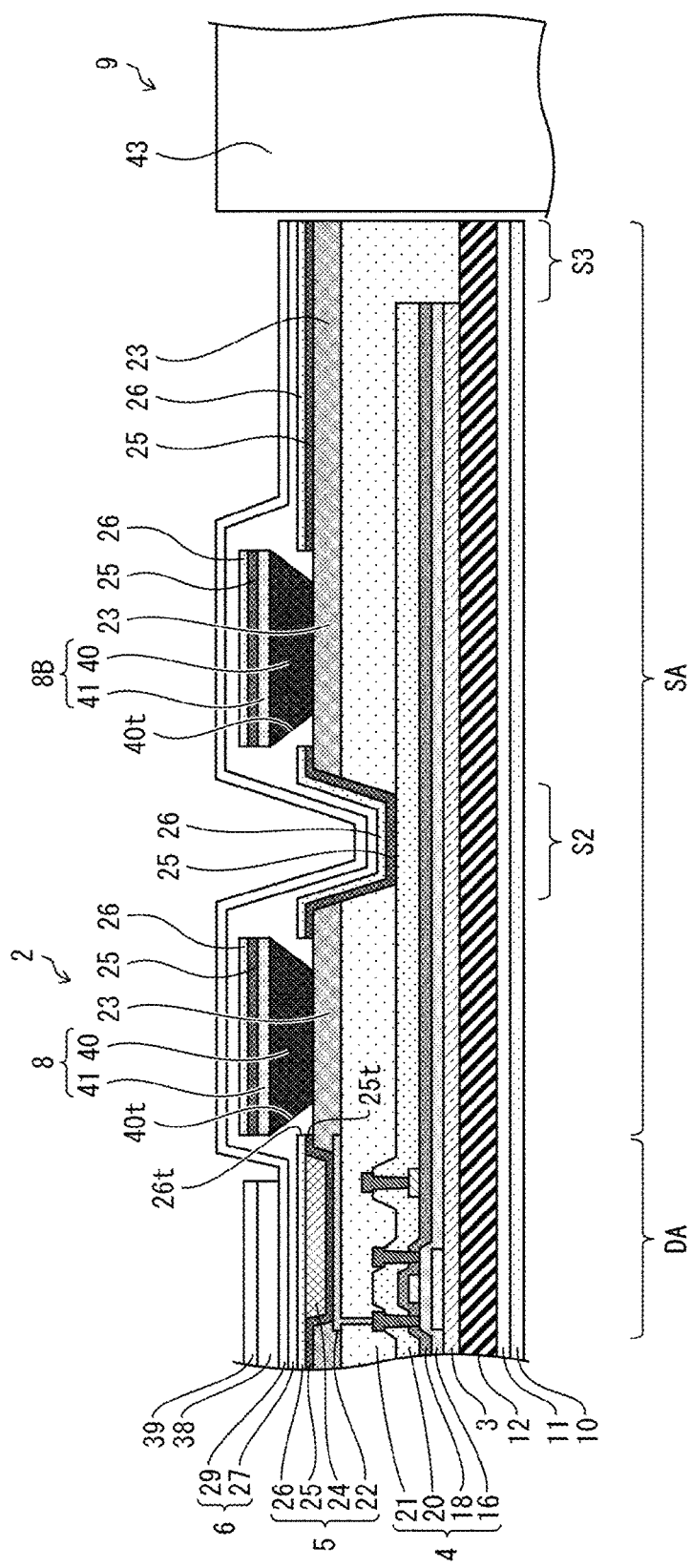
FIG. 27 is a cross-sectional side view illustrating a boundary periphery of an active region and an external module of a display device according to a seventh embodiment of the disclosure.

FIG. 27 illustrates a cross-sectional view of the periphery of an outer edge of an external module 43 of a display device 2 according to the present embodiment. The display device 2 according to the present embodiment, compared to the display device 2 according to the sixth embodiment, differs in further including a protruding portion 8B between the slit S2 and the slit S3. The protruding portion 8B may have the same structure as that of the protruding portion 8 described above. Further, the protruding portion 8B may be formed by the same processes as those of the protruding portion 8 described above.

The display device 2 according to the present embodiment includes a plurality of protruding portions, and a slit of the organic interlayer film 21 and the organic insulating film 23 is formed between the plurality of protruding portions. As a result, it is possible to further reduce the possibility of penetration of foreign matters into an active region DA from the notch 9 through the light-emitting layer 5.

Eighth Embodiment

Figure 28:
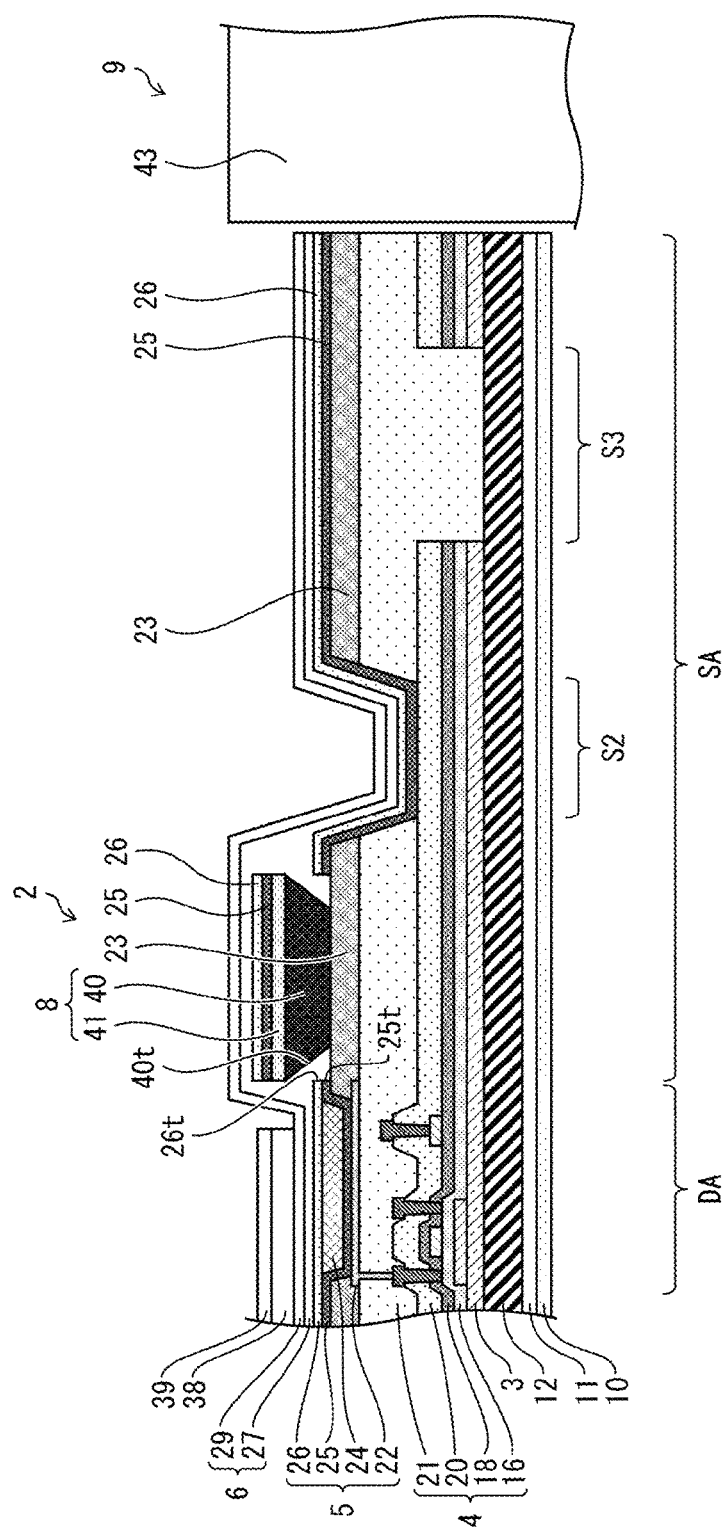
FIG. 28 is a cross-sectional side view illustrating a boundary periphery of an active region and an external module of a display device according to an eighth embodiment of the disclosure.

FIG. 28 illustrates a cross-sectional view of the periphery of an outer edge of an external module 43 of a display device 2 according to the present embodiment. The display device 2 according to the present embodiment, compared to the display device 2 according to the sixth embodiment, differs in including the notch 9 on an inner side of the slit S3. That is, the barrier layer 3, the gate insulating film 16, and the passivation films 18, 20 are formed between the slit S3 and the notch 9.

In the display device 2 according to the present embodiment, an inorganic insulating film is not continuous on a notch 9 side of the slit S3 and on an active region DA side of the slit S3 due to the configuration described above. As a result, it is possible to further reduce the possibility of penetration of foreign matters into the active region DA from the notch 9 through the light-emitting layer 5.

Ninth Embodiment

Figure 29:
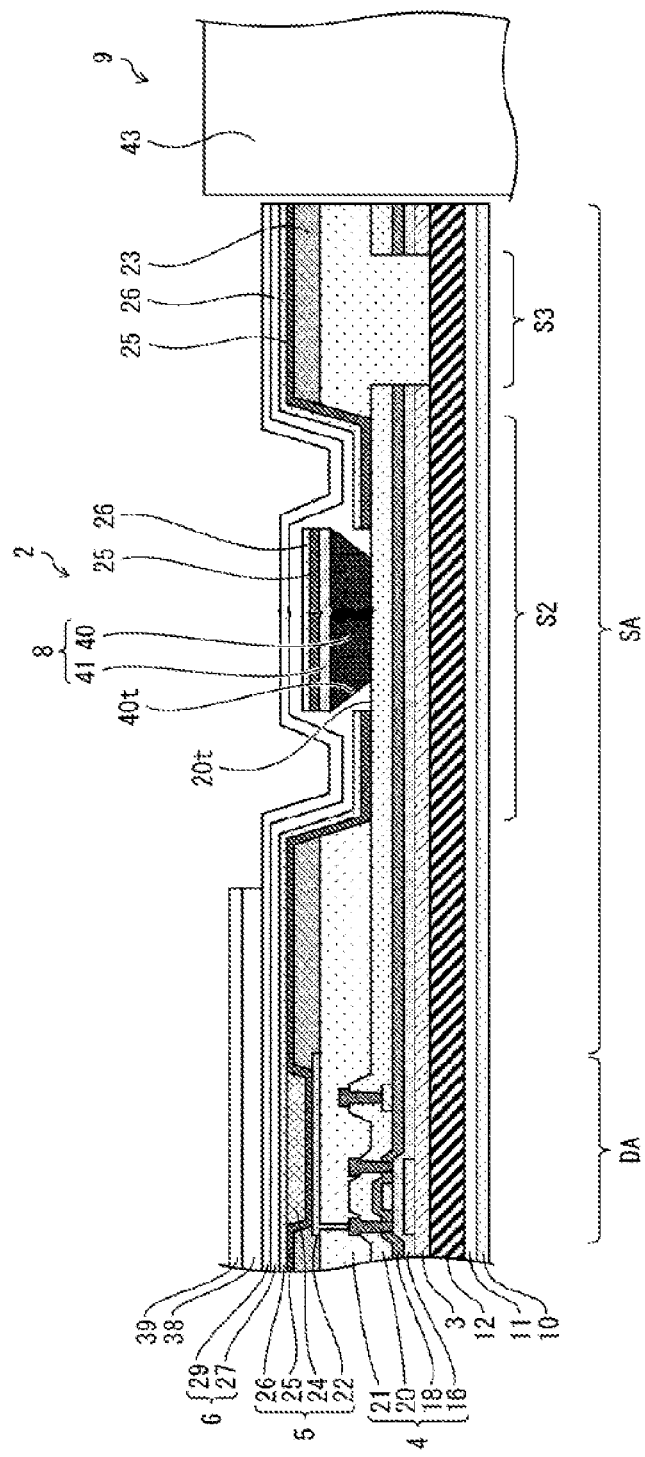
FIG. 29 is a cross-sectional side view illustrating a boundary periphery of an active region and an external module of a display device according to a ninth embodiment of the disclosure.

FIG. 29 illustrates a cross-sectional view of the periphery of an outer edge of an external module 43 of a display device 2 according to the present embodiment. The display device 2 according to the present embodiment, compared to the display device 2 according to the eighth embodiment, differs in that the protruding portion 8 is provided in an interior of the slit S2. In the present embodiment, the protruding portion 8 is formed on the passivation film 20 in the slit S2, that is, on an inorganic insulating film.

The protruding portion 8 may be formed by the same method as that for the protruding portion 8 described above, after formation of the slit S2. After formation of the protruding portion 8 and a light-emitting layer 5, an inorganic sealing film 27 is formed using CVD. As a result, the inorganic sealing film 27 is wrapped around and formed across an upper face 20t of the passivation film 20, which is in the shadow of the inversely tapered face 40t of the protruding portion 8, in a planar view.

Accordingly, the exposed end face 25t of the EL common layer 25 and the end face 26t of the second electrode 26 are covered by the inorganic sealing film 27. Further, the inorganic sealing film 27 and the upper face 20t of the passivation film 20, which is an uppermost layer of an inorganic insulating film, come into contact with each other in an interior of the slit S2. As a result, it is possible to further reduce the possibility of penetration of foreign matters into an active region DA from a notch 9 through the light-emitting layer 5.

Note that, in the present embodiment, the organic interlayer film 21 and the organic insulating film 23 are formed at an end portion of a frame region SA where the notch 9 exists. From the configuration described above, when the display device 2 is a flexible display device, a strength of the periphery of the notch 9 relative to the curvature of the display device 2 can be improved. Nevertheless, the disclosure is not limited thereto, and the organic interlayer film 21 or the organic insulating film 23 does not need to be formed at the end portion of the frame region SA where the notch 9 exists.

Figure 30:
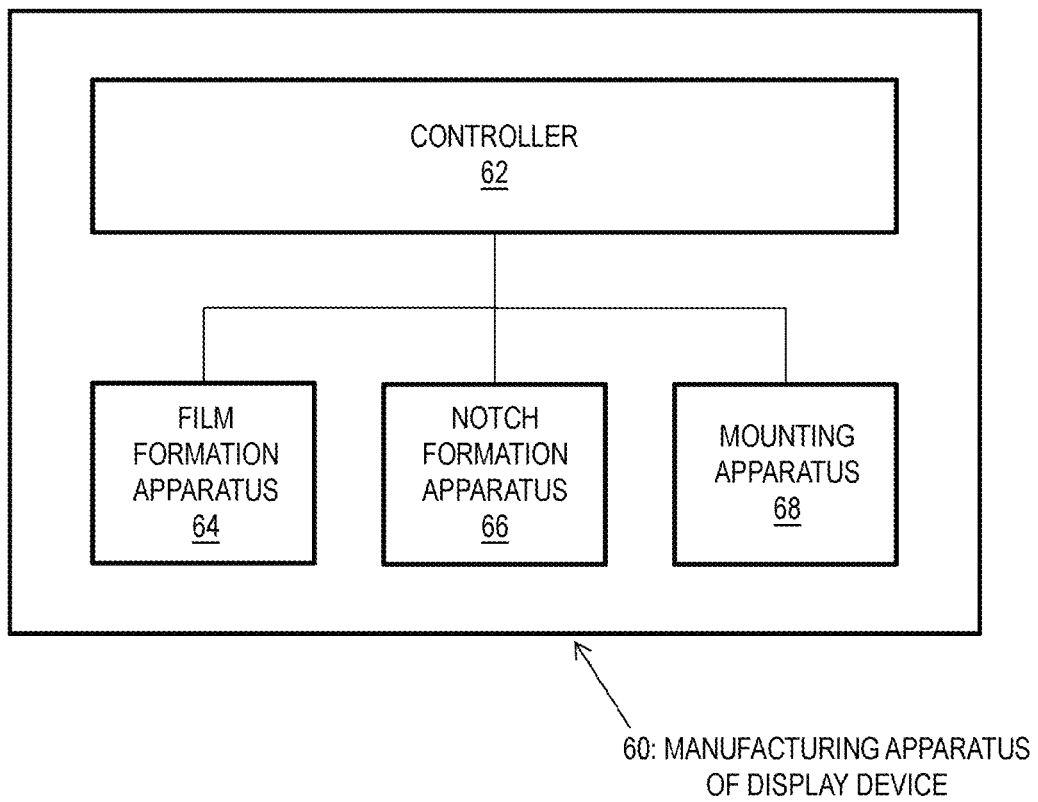
FIG. 30 is a block diagram illustrating a manufacturing apparatus of the display device of each of the embodiments of the disclosure.

FIG. 30 is a block diagram illustrating a display device manufacturing apparatus 60 used in the manufacturing process of the display device 2 of each of the embodiments described above. The display device manufacturing apparatus 60 includes a controller 62, a film formation apparatus 64, a notch formation apparatus 66, and a mounting apparatus 68. The controller 62 controls the action of the film formation apparatus 64, the notch formation apparatus 66, and the mounting apparatus 68. The film formation apparatus 64 may form each layer of the display device 2, including the light-emitting layer 5. The notch formation apparatus 66 may form the notch 9. The mounting apparatus 68 may mount the external module 43 on the notch 9.

Supplement

A display device according to a first aspect includes a base material, a TFT layer formed on the base material, an organic insulating film formed on the TFT layer, a light-emitting layer formed on the organic insulating film, and a sealing layer formed on the light-emitting layer. The display device further includes an active region configured to contribute to a display, a notch formed in a position surrounded by an end portion of the active region, and a protruding portion formed on a peripheral end side of the active region where the notch is formed. In such a display device, the light-emitting layer is disconnected as a result of a step at the protruding portion.

According to a second aspect, the display device further includes a first electrode, and a second electrode above the first electrode, the light-emitting layer is formed between the first electrode and the second electrode, the organic insulating film is formed on the first electrode, and the protruding portion is formed on the organic insulating film.

According to a third aspect, the sealing layer is configured to cover an end face of the light-emitting layer.

According to a fourth aspect, the sealing layer includes an inorganic layer.

According to a fifth aspect, the protruding portion includes a side face that is partially an inversely tapered face.

According to a sixth aspect, the protruding portion includes a photosensitive resin.

According to a seventh aspect, the photosensitive resin is a negative-working photosensitive resin.

According to an eighth aspect, the protruding portion includes a metal.

According to a ninth aspect, the display device further includes an electrode in a lower layer of the light-emitting layer, and the electrode and the metal are configured to be electrically conducted.

According to a tenth aspect, an end face of the light-emitting layer exists in a position overlapping the inversely tapered face, in a planar view.

According to an eleventh aspect, the TFT layer includes an organic interlayer film, and a slit in the organic interlayer film and the organic insulating film is formed between the notch and the protruding portion.

According to a twelfth aspect, the display device further includes a plurality of the protruding portion, and the slit is formed between at least two of the plurality of protruding portions.

According to a thirteenth aspect, the TFT layer includes an inorganic insulating film, and a slit in the inorganic insulating film is formed between the notch and the protruding portion.

According to a fourteenth aspect, the TFT layer includes an organic interlayer film and an inorganic insulating film, a slit in the organic interlayer film and the organic insulating film is formed between the active region and the notch, and the protruding portion is formed on the inorganic insulating film in an interior of the slit.

According to a fifteenth aspect, the sealing layer and the inorganic insulating film are in contact in the interior of the slit.

According to a sixteenth aspect, the display device further includes a plurality of drivers used for driving the light-emitting layer, the active region is divided into a plurality of regions, and the driver configured to drive the light-emitting layer differs in the plurality of regions.

According to a seventeenth aspect, the display device further includes an external module in the notch.

A manufacturing method of a display device according to an eighteenth aspect is a manufacturing method of a display device including a base material, a TFT layer formed on the base material, an organic insulating film formed on the TFT layer, a light-emitting layer formed on the organic insulating film, and a sealing layer formed on the light-emitting layer. The manufacturing method includes a protruding portion forming step for forming a protruding portion below the light-emitting layer in a position surrounded by an end portion of an active region contributing to display, a light-emitting layer forming step for forming the light-emitting layer on the organic insulating film and the protruding portion, and disconnecting the light-emitting layer as a result of a step at the protruding portion, and a notch forming step for forming a notch in a position surrounded by the protruding portion.

According to a nineteenth aspect, the display device includes a first electrode and a second electrode above the first electrode, the organic insulating film is formed on the first electrode, the protruding portion forming step forms the protruding portion on the organic insulating film, and the light-emitting layer forming step forms the light-emitting layer between the first electrode and the second electrode.

According to a twentieth aspect, the protruding portion includes a side face that is partially an inversely tapered face.

According to a twenty-first aspect, the protruding portion forming step forms the inversely tapered face using a negative-working photosensitive resin.

According to a twenty-second aspect, the protruding portion includes a metal, and the inversely tapered face is formed using isotropic etching of the metal.

According to a twenty-third aspect, the light-emitting layer forming step forms an end face of the light-emitting layer in a position overlapping the inversely tapered face, in a planar view.

According to a twenty-fourth aspect, the manufacturing method of a display device further includes a sealing layer forming step for forming a sealing layer configured to cover an end face of the light-emitting layer in an upper layer of the light-emitting layer, and the sealing layer forming step forms the sealing layer in a lower portion of the inversely tapered face in a planar view.

According to a twenty-fifth aspect, the TFT layer includes an organic interlayer film, and a slit in the organic insulating film and the organic interlayer film is formed between the notch and the protruding portion.

According to a twenty-sixth aspect, the protruding portion forming steps forms a plurality of the protruding portions, and forms the slit between at least two of the plurality of protruding portions.

According to a twenty-seventh aspect, the TFT layer includes an inorganic insulating film, and a slit in the inorganic insulating film is formed between the notch and the protruding portion.

According to a twenty-eighth aspect, the TFT layer includes an organic interlayer film and an inorganic insulating film, a slit in the organic insulating film and the organic interlayer film is formed between the active region and the notch, and the protruding portion forming step forms the protruding portion on the inorganic insulating film in an interior of the slit.

According to a twenty-ninth aspect, the light-emitting layer forming step forms a slit in an inorganic layer above the base material in a portion of a position where the notch is formed, and the notch forming step pierces only the slit to form the notch.

A manufacturing apparatus of a display device according to a thirtieth aspect is a manufacturing apparatus of a display device including a base material, a TFT layer formed on the base material, an organic insulating film formed on the TFT layer, a light-emitting layer formed on the organic insulating film, and a sealing layer formed on the light-emitting layer. The manufacturing apparatus includes a film formation apparatus configured to form a protruding portion below the light-emitting layer and the light-emitting layer on the organic insulating film and the protruding portion, and disconnect the light-emitting layer as a result of a step at the protruding portion, and a notch formation apparatus configured to form a notch in a position surrounded by the protruding portion.

The disclosure is not limited to each of the embodiments stated above, and various modifications may be implemented without departing from the scope of claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
5 Light-emitting layer
6 Sealing layer
8, 8B Protruding portion
9 Notch
10 Base material
21 Organic interlayer film
22 First electrode
23 Organic insulating film
24 EL light-emitting layer
25 EL common layer
26 Second electrode
27, 29 Inorganic sealing film
40 Metal layer
40h Contact portion
40t, 41t Inversely tapered face
41 Resist layer
43 External module
46 First gate driver
47 First source driver
48 Second gate driver
49 Second source driver
50 Glass substrate
60 Manufacturing apparatus of display device

The invention claimed is:
1. A display device comprising:
a base material;
a thin-film transistor (TFT) layer on the base material;
an organic insulating film on the TFT layer;
a light-emitting layer on the organic insulating film;
a sealing layer on the light-emitting layer;
an active region that displays an image;
a notch surrounded by an end portion of the active region; and
a first protruding portion on a peripheral end side of the active region where the notch is located, wherein
the light-emitting layer is disconnected as a result of a step at the first protruding portion,
the TFT layer includes an organic interlayer film and an inorganic insulating film,
a first slit in the organic interlayer film and the organic insulating film is between the active region and the notch,
the first protruding portion is in an interior of the first slit on the inorganic insulating film, and
the first protruding portion is located on the inorganic insulating film, and the inorganic insulating film includes a second slit between the first protruding portion and the notch, the second slit not overlapping with the first protruding portion and being positioned closer to the notch than to the first protruding portion, the second slit overlapping the organic interlayer film and the organic insulating film.
2. The display device according to claim 1, wherein the sealing layer is configured to cover an end surface of the light-emitting layer.

3. The display device according to claim 1, wherein the sealing layer includes an inorganic layer.

4. The display device according to claim 1, wherein the first protruding portion includes a side surface that is partially an inversely tapered surface.

5. The display device according to claim 1, wherein the first protruding portion includes a photosensitive resin.

6. The display device according to claim 5, wherein the photosensitive resin is a negative-working photosensitive resin.

7. The display device according to claim 1, wherein the first protruding portion includes a metal.

8. The display device according to claim 7, further comprising:
   an electrode in a lower layer of the light-emitting layer, wherein the electrode and the metal are configured to be electrically conducted.

9. The display device according to claim 4, wherein an end surface of the light-emitting layer exists in a position overlapping the inversely tapered surface, in a planar view.

10. The display device according to claim 1, wherein the sealing layer and the inorganic insulating film are in contact in the interior of the first slit.

11. The display device according to claim 1, further comprising:
    a plurality of drivers used for driving the light-emitting layer, wherein
    the active region is divided into a plurality of regions, and
    ones of the plurality of drivers that drive the light-emitting layer differ in the plurality of regions.

12. The display device according to claim 1, further comprising:
    an external module in the notch.

* * * * *